US010144212B2

(12) United States Patent
Casiraghi et al.

(10) Patent No.: US 10,144,212 B2
(45) Date of Patent: Dec. 4, 2018

(54) INK FORMULATION

(71) Applicant: The University of Manchester, Manchester (GB)

(72) Inventors: Cinzia Casiraghi, Manchester (GB); Veronica Sanchez Romaguera, Manchester (GB)

(73) Assignee: The University of Manchester, Manchester (GB)

( * ) Notice: Subject to any disclaimer, the term of this patent is extended or adjusted under 35 U.S.C. 154(b) by 158 days.

(21) Appl. No.: 15/110,368

(22) PCT Filed: Jan. 30, 2015

(86) PCT No.: PCT/GB2015/050225
§ 371 (c)(1),
(2) Date: Jul. 7, 2016

(87) PCT Pub. No.: WO2015/114354
PCT Pub. Date: Aug. 6, 2015

(65) Prior Publication Data
US 2016/0325543 A1 Nov. 10, 2016

(30) Foreign Application Priority Data
Jan. 31, 2014 (GB) .................................. 1401721.4

(51) Int. Cl.
| | | |
|---|---|---|
| C09D 11/52 | (2014.01) | |
| C09D 11/38 | (2014.01) | |
| C01B 32/19 | (2017.01) | |
| B41J 2/01 | (2006.01) | |
| H01L 29/16 | (2006.01) | |
| H01L 29/45 | (2006.01) | |
| H01L 31/028 | (2006.01) | |
| H01L 31/113 | (2006.01) | |

(52) U.S. Cl.
CPC ................. *B41J 2/01* (2013.01); *C01B 32/19* (2017.08); *C09D 11/38* (2013.01); *C09D 11/52* (2013.01); *H01L 29/1606* (2013.01); *H01L 29/45* (2013.01); *H01L 29/458* (2013.01); *H01L 31/028* (2013.01); *H01L 31/1136* (2013.01)

(58) Field of Classification Search
CPC ......... C09D 11/38; C09D 11/52; C01B 32/19; H01L 29/1606; H01L 29/45; H01L 29/458; B41J 2/01
USPC .............................................. 106/31.92, 31.9
See application file for complete search history.

(56) References Cited

U.S. PATENT DOCUMENTS

| | | | | |
|---|---|---|---|---|
| 2010/0000441 | A1* | 1/2010 | Jang ........................ | C09D 11/52 106/31.13 |
| 2011/0045223 | A1* | 2/2011 | Lin ....................... | C01B 21/0687 428/36.9 |
| 2012/0104329 | A1 | 5/2012 | Meyer et al. | |
| 2012/0127236 | A1* | 5/2012 | Endoh ..................... | C09D 11/38 106/31.13 |
| 2012/0241690 | A1* | 9/2012 | Janowska ............... | C01B 32/19 252/511 |
| 2012/0288762 | A1* | 11/2012 | Hardin ..................... | C01B 32/19 429/213 |
| 2012/0326093 | A1 | 12/2012 | Landorf | |
| 2013/0302593 | A1* | 11/2013 | Coleman ................. | C01B 32/19 428/323 |
| 2014/0193575 | A1* | 7/2014 | Hosmane ............... | C09D 11/52 427/122 |
| 2015/0083206 | A1* | 3/2015 | Novoselov ............. | B82Y 30/00 136/256 |
| 2015/0279506 | A1* | 10/2015 | Wolfrum ................. | C01B 32/19 252/510 |
| 2015/0337145 | A1* | 11/2015 | Torrisi ................. | C09D 11/037 106/31.13 |
| 2016/0340533 | A1* | 11/2016 | Casiraghi ............... | C09D 11/52 |

FOREIGN PATENT DOCUMENTS

| | | |
|---|---|---|
| JP | H10-298478 A1 | 11/1998 |
| JP | 2006503139 A | 1/2006 |
| JP | 2013527267 A | 6/2013 |
| JP | 201498074 A | 5/2014 |
| WO | WO 2011/066332 A2 * | 6/2011 |
| WO | 2012138632 A2 | 10/2012 |
| WO | 2012177975 A1 | 12/2012 |
| WO | 2013074709 A1 | 5/2013 |
| WO | WO 0214/053510 A1 * | 4/2014 |
| WO | WO 2014/064432 A1 * | 5/2014 |
| WO | 2015114354 A1 | 8/2015 |

(Continued)

OTHER PUBLICATIONS

English translation of JP 2014/098074, May 2014; 22 pages.*
Huang et al.; "Graphene-Based Conducting Inks for Direct Inkjet Printing of Flexible Conductive Patterns and Their Applications in Electric Circuits and Chemical Sensors"; Nano Res. (Jul. 2011) 4:675-684; https://doi.org/10.1007/s12274-011-0123-z; 10 pages.*
Shin et al.; "Flexible and transparent graphene films as acoustic actuator electrodes using inkjet printing"; Chem. Commun., Jun. 2011, 47, 8527-8529; 3 pages.*
PCT/GB2015/050225 International Search Report and Written Opinion dated Apr. 15, 2015; 14 pages.

(Continued)

*Primary Examiner* — Helene Klemanski
(74) *Attorney, Agent, or Firm* — Linda B. Huber; Nixon Peabody LLP

(57) ABSTRACT

The present invention relates to an ink formulation comprising two-dimensional inorganic layered particles. The ink formulations of the present invention are for inkjet printing. The present invention also relates to a process for the preparation of these ink formulations, to the use of these ink formulations for the production of printed films and tracks comprising the inorganic material, to the films or tracks produced by the inkjet printing these ink formulations, and to devices that comprise these films or tracks.

18 Claims, 20 Drawing Sheets

(56) References Cited

FOREIGN PATENT DOCUMENTS

WO  2015114357 A2  8/2015

OTHER PUBLICATIONS

GB Application No. 1401721.4 Search Report dated Sep. 16, 2014; 3 pages.
An et al. Stable Aqueous Dispersions of Noncovalently Functionalized Graphene from Graphite and their Multifunctional High-Performance Applications. Nano Letters (2010). 10:4295-4301.
Ciesielski et al. Graphene via sonication assisted liquid-phase exfoliation. Chem Soc Rev (2014). 43:381-398.
Parviz et al. Dispersions of Non-Covalently Functionalized Graphene with Minimal Stabilizer. ACS Nano (2012). 6 (10):8857-8867.
Po et al. Polymer- and carbon-based electrodes for polymer solar cells: Toward low-cost, continuous fabrication over large area. Solar Energy Materials & Solar Cells (2012). 100:97-114.
Withers et al. Supplemental Materials for Heterostructures produced from nanosheet-based inks. Retrieved from the internet: <<http://pubs.acs.org/doi/suppl/10.1021/nl501355j//suppl_file/nl501355j_si_001.pdf>> on Mar. 30, 2015; 14 pages.
Yang et al. A simple method for graphene production based on exfoliation of graphite in water using 1-pyrenesulfonic acid sodium salt. Carbon (2013). 53:357-365.
Sukhraaj Johal, Chemical Exfoliation of Graphene and Other 2D-Materials, Aug. 23, 2013, A Thesis Submitted to the University of Manchester for the Degree of Master of Philosophy in the Faculty of Engineering and Physical Sciences, Manchester eScholar, pp. 1-71.
Office Action of JP 2016-547151 dated Aug. 22, 2018, 3 Pages.

\* cited by examiner

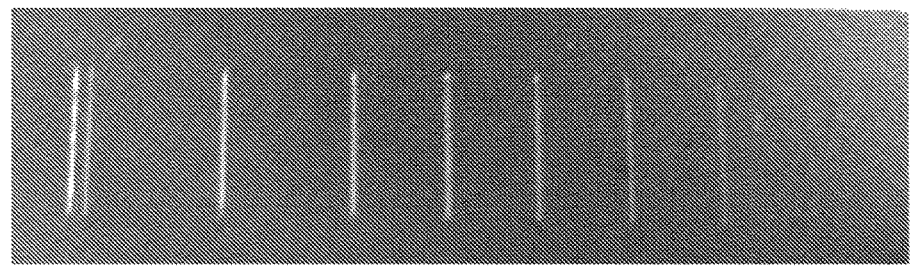

INK FORMULATION

CROSS-REFERENCE TO RELATED APPLICATIONS

This application is a National Phase of International Application No. PCT/GB2015/050225 filed Jan. 30, 2015, currently pending, which designated the U.S. and that International Application was published under PCT Article 21(2) in English. Both applications also include a claim of priority under 35 U.S.C. § 119(a) and § 365(b) to British patent application No. GB 1401721.4 filed Jan. 31, 2014, the entirety of which is hereby incorporated by reference.

INTRODUCTION

The present invention relates to an ink formulation and, more specifically, to an ink formulation that comprises nanosheets of an inorganic material and which is suitable for inkjet printing. The present invention also relates to a process for the preparation of these ink formulations, to the use of these ink formulations for the production of printed films and tracks comprising the inorganic material, to the films or tracks produced by the inkjet printing these ink formulations, and to devices that comprise these films or tracks.

BACKGROUND OF THE INVENTION

The advent of graphene (K. S. Novoselov, A. K. Geim, S. V. Morozov, D. Jiang, Y. Zhang, S. V. Dubonos, I. V. Grigorieva and A. A. Firsov, "Electric field Effect in Atomically Thin Carbon Films" Science, Vol. 306, No. 5696, pp. 666-669, 2004) and subsequent discovery of its multitude of superior properties, has led to the identification of many other two-dimensional inorganic crystals through the exfoliation of other layered inorganic compounds. Other materials which have been isolated as single or few layer platelets include hexagonal boron nitride, $NbSe_2$, bismuth strontium calcium copper oxide (BSCCO) and $MoS_2$. The nanosheets formed comprise a single or few layers (or sheets) that are stable and can exhibit complementary electronic properties to graphene, such as being insulators, semiconductors and superconductors.

The large variety of two-dimensional atomic crystals isolated in the recent years offers a rich platform for the creation of heterostructures which combine several of these materials in one stack. Since, collectively, this class of materials covers a very broad range of properties, the obtained heterostructures can be tuned to focus on particular phenomena, or be used for specific applications (or even to perform multiple functions).

Thus, nanosheets of inorganic two-dimensional materials can be used either alone or in combination with other such materials to form ultrathin electronic devices with astonishing properties. BN and $MoS_2$ have been used in conjunction with graphene to form quantum tunnelling transistor heterostructures (WO2012/127245) while $MoS_2$ and $WS_2$ have been used in conjunction with graphene to form photovoltaic heterostructures (WO2013/140181).

To date, heterostructures have generally been produced by micromechanical cleavage of bulk ("three-dimensional") layered crystals with subsequent dry transfer of each crystal layer. While this technique enables the production of extremely high quality heterostructures, it cannot be applied to the production of such heterostructures on a large scale. Consequently, an alternative method, suitable for mass-production, should be utilised to bring the attractive qualities of such systems to real-life applications.

Liquid-phase exfoliation is a scalable approach for production of nanosheets or flakes of two-dimensional crystals, based on exfoliation of their bulk counterparts via chemical wet dispersion followed by ultra-sonication. This technique offers many advantages in terms of cost reduction, scalability and compatibility with any substrate, including cheap and flexible substrates. Currently this is mostly based on the use of organic solvents such as N-Methylpyrrolidone (NMP) and N,N-dimethylformamide (DMF), which are toxic, expensive and characterized by high boiling points.

The preparation of inkjet printable formulations containing nanosheets of exfoliated inorganic materials (such as graphene, hexagonal boron nitride, $NbSe_2$, bismuth strontium calcium copper oxide (BSCCO), $WS_2$ and/or $MoS_2$) is of particular interest.

Inkjet prinifing can be used for a wide variery of applications, including the preparation of printed coatings and printed electronic devices. Printed electronic devices are increasingly used in a wide range of commercial applications such as, for example, portable electronic devices, signage, lighting, product identification, flexible electronics, photovoltaic systems, medical equipment, antennas (such as RFID antennas), displays, sensors, thin film batteries, electrodes and many others.

Printed electronics are typically made by printing inks onto a substrate to form he electronic device.

The use of printed electronics has a number of advantages over conventional fabrication processes. In particular, printed conductive and insulative patterns are typically: faster to produce than subtractive processes (such as etching); less wasteful; less hazardous (i.e. use less hazardous chemicals); less expensive than concentional techniques; compatible with a wide range of substrates; simple to implement; and enable the possibility of further post-fabrication processing.

Computer-controlled printer technology also allows for very high-resolution printing on to a wide variety of substrates, including glass, plastic, or ceramics for electronics or display applications. Inkjet printing involves the placement of small drops of ink onto a substrate surface in response to a digital signal. Typically, the ink is transferred or jetted onto the surface without physical contact between the printing device and the surface. Within this general technique, the specific method by which the inkjet ink is deposited onto the substrate surface varies from system to system, and includes continuous ink deposition and drop-on-demand ink deposition. Ink droplets are ejected by the print head nozzle and are directed to the substrate surface.

In order to be suitable for inkjet printing, the ink needs to meet a number of performance criteria, such as a viscosity within the range 2 to 30 cPs; a surface tension within the range 20 to 50 mN/m (and preferably 28 to 35 mN/m) and a low rate of evaporation at ambient temperatures (to prevent clogging of the printer head). Despite a number of inkjet-printable inks being available, there remains a need for new and improved ink formulations. In particular, there is a need for new and improved aqueous formulations comprising nanosheets of inorganic materials, such as high-quality graphene.

It is therefore an object of the present invention to provide an ink formulation that is suitable for inkjet printing and the preparation of printed electronics.

The present invention was devised with the foregoing in mind.

SUMMARY OF THE INVENTION

According to a first aspect of the present invention there is provided an ink formulation suitable for inkjet printing, said formulation comprising a plurality of nanosheets dispersed in an aqueous vehicle;

wherein greater than 50% of the nanosheets comprise less than ten layers of an inorganic layered material and the aqueous vehicle comprises:
  (i) at least one water soluble polycyclic aromatic compound, (e.g. a salt thereof); wherein the or each polycyclic aromatic compound independently has a ring system which comprises from 2 to 10 fused aromatic benzene rings, the ring system being substituted with from 1 to 6 (e.g. 1 to 4) independently selected hydrophillic groups, each hydrophilic group consisting of less than 20 atoms;
  (ii) at least one viscosity modifier; and
  (iii) at least one surface tension modifier.

According to a second aspect of the present invention, there is provided a process for the preparation of an ink formulation as defined in the first aspect of the invention, the process comprising:
  a) providing multi-layered bulk inorganic material (e.g. particles of the inorganic material) in an aqueous vehicle as defined herein;
  b) subjecting the multilayered particles of the inorganic material in the aqueous vehicle to energy (e.g. sonic energy) to obtain an aqueous dispersion of nanosheets in the aqueous vehicle, wherein greater than 50% of the nanosheets comprise less than ten layers of the an inorganic layered material; and
  c) when the dispersion obtained in step b) also comprises multilayered particles of the inorganic layered material, the method optionally further comprises the step of reducing the amount of multilayered particles of the inorganic layered material in the suspension.

According to a third aspect of the present invention, there is provided an ink formulation obtainable by, obtained by, or directly obtained by the process of the second aspect of the present invention.

According to a fourth aspect of the present invention, there is provided the use of an ink formulation as defined herein for the production of printed films and/or tracks.

According to a fifth aspect of the present invention, there is provided a film and/or track prepared by the inkjet printing of an ink formulation as defined herein onto a substrate.

According to a sixth aspect of the present invention, there is provided an electronic device or component comprising a film or track according to the fifth aspect of the present invention.

BRIEF DESCRIPTION OF THE DRAWINGS

Embodiments of the invention will be described, by way of example only, with reference to the accompanying drawings, in which:

FIG. 2B are the pattern coordinates used to print the comb pattern displayed in FIG. 2A;

FIG. 6B are the pattern coordinates used to print the zigzag pattern displayed in FIG. 6A;

FIG. 9D is a digital photograph showing a series of lines formed by the inkjet printing of the formulation prepared in Example 4 herein, onto Si after 1, 5, 10, 20, 30, 40, 50, 10 and 60 passes as shown by the numbers next to the lines in the Figure;

DETAILED DESCRIPTION OF THE INVENTION

Figure 1A:
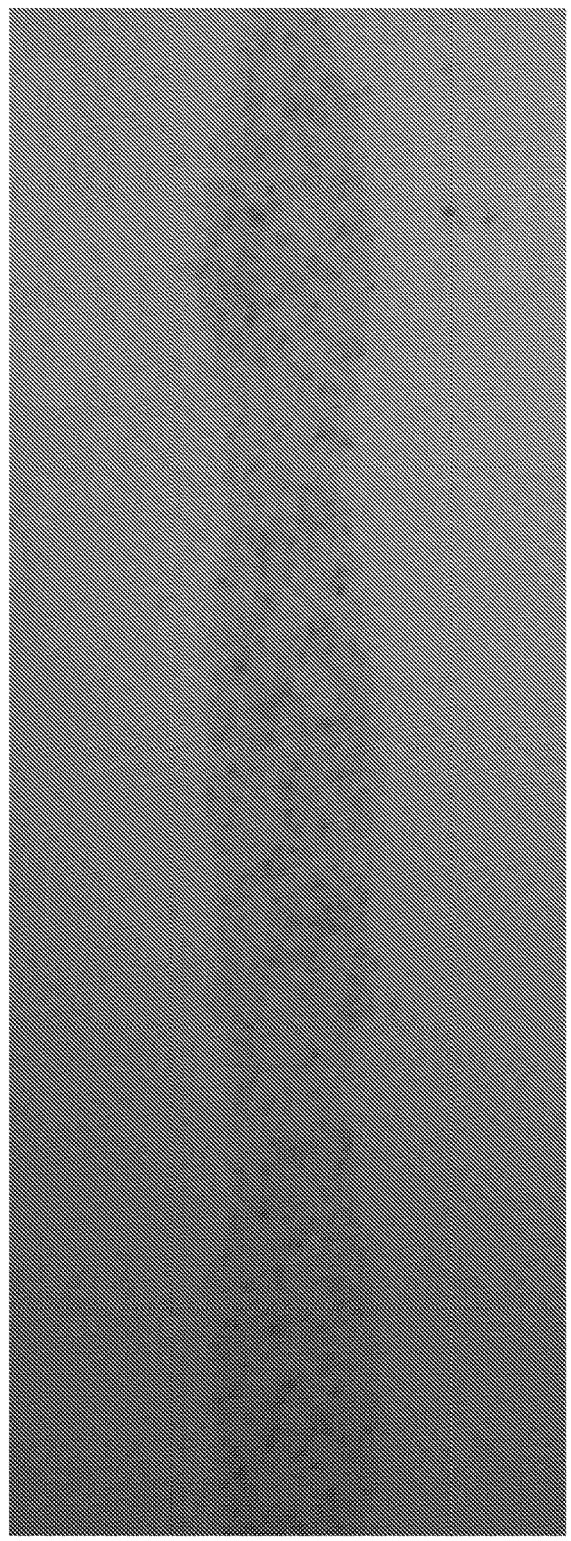
FIG. 1A is a digital photograph showing a printed line formed by the inkjet printing of the formulation prepared in Example 1 herein.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

Ink Formulations

As indicated above, the present invention provides, in a first aspect, an ink formulation suitable for inkjet printing, said formulation comprising a plurality of nanosheets dispersed in an aqueous vehicle;

wherein the greater than 50% of the nanosheets comprise less than ten layers of an electrically conductive layered inorganic material and the aqueous vehicle comprises:
 (i) at least one water soluble polycyclic aromatic compound (e.g. a salt thereof); wherein the or each polycyclic aromatic compound independently has a ring system which comprises from 2 to 10 fused aromatic benzene rings, the ring system being substituted with from 1 to 4 independently selected hydrophillic groups, each hydrophilic group consisting of less than 20 atoms;
 (ii) at least one viscosity modifier; and
 (iii) at least one surface tension modifier.

In order to be suitable for inkjet printing, the ink formulations of the present invention suitably have a viscosity within the range of 2 to 30 cPs.

In a particular embodiment the viscosity is within the range of 10 to 12 cPs.

Suitably, the formulations of the present invention have a surface tension within the range 20 to 50 mN/m. More suitably, the formulations of the present invention have a surface tension within the range 28 to 45 mN/m. In an embodiment, the formulations of the present invention have a surface tension within the range 28 to 35 mN/m.

Suitably, the ink formulations of the present do not evaporate readily, i.e. they are non-volatile at normal inkjet printing temperatures (e.g. at a standard room temperature of 20 to 25° C.). This prevents the clogging of the printer nozzle.

In a particular aspect, the ink formulation is an inkjet formulation.

Nanosheets of Inorganic Material

The nanosheets present in the formulation of the present invention are suitably prepared by the exfoliation of larger particles of the multi-layered inorganic material. The nanosheets formed by the exfoliation process may consist of a single layer or nanosheet or two or more layers or nanosheets of the inorganic material.

The majority (greater than 50%) of the nanosheets of inorganic material present in the ink formulations of the present invention comprise less than ten layers of the inorganic material.

In an embodiment, greater than 60% of the nanosheets of inorganic material present in the ink formulations of the present invention comprise less than ten layers of the inorganic material. In a further embodiment, greater than 75% of the nanosheets of inorganic material present in the ink formulations of the present invention comprise less than ten layers of the inorganic material. In another embodiment, greater than 80% of the nanosheets of inorganic material present in the ink formulations of the present invention comprise less than ten layers of the inorganic material. In a further embodiment, greater than 90% of the nanosheets of inorganic material present in the ink formulations of the present invention comprise less than ten layers (or sheets) of the inorganic material.

Suitably, the proportion of nanosheets having less than 10 layers is as high as possible. More suitably, the proportion of nanosheets having less than 8 layers is a high as possible.

The proportion of single layer nanosheets is also suitably as high as possible, e.g. greater than 15%, or more preferably greater 20%, of the nanosheets present in the formulation. The amount of single layered material present will depend in part of the conditions (energy input and time) used to prepare the nanosheets.

Suitably, the inorganic material is crystalline or at least partially crystalline.

The term 'inorganic material' refers to any inorganic material made up of one or more elements (including carbon) which forms layered structures in which the bonding between atoms within the same layer is covalent and the layers are held together by Van der Waals forces.

Many inorganic compounds exist in a number of allotropic forms, some of which are layered and some of which are not. For example boron nitride can exist in a layered graphite-like structure or as a diamond-like structure in which the boron and nitrogen atoms are tetrahedral orientated.

Examples of layered inorganic compounds to which the present invention can be applied include: graphene, hexagonal boron nitride, bismuth strontium calcium copper oxide (BSCCO), transition metal dichalcogenides (TMDCs), $Sb_2Te_3$, $Bi_2Te_3$ and $MnO_2$.

TMDCs are structured such that each layer of the material consists of a three atomic planes: a layer of transition metal atoms (for example Mo, Ta, W) sandwiched between two layers of chalcogen atoms (for example S, Se or Te). Thus in one embodiment, the TMDC is a compound of one or more of Mo, Ta and W with one or more of S, Se and Te. There is strong covalent bonding between the atoms within each layer of the transition metal chalcogenide and predominantly weak Van der Waals bonding between adjacent layers. Exemplary TMDCs include $NbSe_2$, $WS_2$, $MoS_2$, $TaS_2$, $PtTe_2$, $VTe_2$.

The term 'two-dimensional heterostructure' refers to a plurality of mono- or few-layered nanosheets arranged in a stack. A heterostructure comprises at least two different materials. The mono- or few-layered nanosheets may be arranged such that the heterostructures are substantially parallel, being arranged face-to-face, forming a laminate. Any layer of the heterostructure may be a single crystal (e.g. that formed by CVD) or it may be a thin layer of mono- or few-layered nanosheets. Such heterostructures may also be called vertical heterostructures. Various structures may be intercalated between the crystals e.g. nanosheets, nanotubes, quantum dots and wires. It may be, however, that the heterostructure is formed entirely of two-dimensional crystals. This does not preclude the heterostructure from being mounted on a substrate and/or have a protective coating. Nor does it preclude the possibility that nanostructures are present but are not intercalated between the layers. A two-dimensional heterostructure is so-called because it is comprised of two-dimensional crystals. It will itself, of course, be a three dimensional structure. A heterostructure may comprise graphene in addition to the inorganic layered materials made according to the first aspect.

A two-dimensional crystal of a layered material (e.g. an inorganic material or graphene) is a single or few layered nanosheet of that material.

Any suitable inorganic layered material may be used to form the nanosheets. In an embodiment, the inorganic layered material is selected from graphene, hexagonal boron nitride, $WS_2$ and/or $MoS_2$.

In a particular embodiment, the inorganic material is graphene.

Graphene is the name given to a particular crystalline allotrope of carbon in which each carbon atom is bound to three adjacent carbon atoms (in a $sp^2$ hybridised manner) so as to define a one atom thick planar sheet of carbon. The carbon atoms in graphene are arranged in the planar sheet in a honeycomb-like network of tessellated hexagons. Graphene is often referred to as a 2-dimensional crystal becasue it represents a single nanosheet or layer of carbon of nominal (one atom) thickness. Graphene is a single sheet of graphite.

In the present invention, the nanosheets may comprise single layers of graphene or thin stacks of two to ten graphene layers. The thin stacks of graphene are distinguished from graphite by their thinness and a difference in physical properties. In this regard, it is generally acknowledged that crystals of graphene which have more than 10 molecular layers (i.e. 10 atomic layers; 3.5 nm) generally exhibit properties more similar to graphite than to graphene. Thus, throughout this specification, the term graphene is intended to mean a carbon nanostructure with up to ten graphene layers.

For the avoidance of doubt, the term graphene used herein does not encompass graphene oxide or any other form of covalently modified graphene.

In certain embodiments, the inorganic material may be h-BN. Single layer h-BN is structurally similar to graphene, but unlike its carbon analogue, it is an insulator with a large band gap (~6 eV). This, added to unique features such as excellent chemical, mechanical properties, and thermal stability, allows using h-BN nanosheets (BNNS) in a variety of applications, such as component in nanodevices, solid lubricant, UV-light emitter and as insulating thermo-conductive filler in composites.

The inorganic material may also be a transition metal dichalcogen (e.g. $MoS_2$, $WS_2$, $MoTe_2$, $MoSe_2$ etc.).

Each nanosheet has a length and a width dimension to define the size of the plane of the nanosheet. Suitably, the length and width of the nanosheets are within the range of 10 nm to 2 microns. More suitably, the length and width of the nanosheets are within the range of 10 nm to 500 nm.

For example, it may be that greater than 75% (e.g. greater than 90% or greater than 98%) of the nanosheets of an inorganic layered material have a length or width dimension of between 10 nm and 2 microns. It may be that greater than 75% (e.g. greater than 90% or greater than 98%) of the nanosheets have a length or width dimension of less than 1 micron. Thus, it may be that greater than 75% (e.g. greater than 90% or greater than 98%) of the nanosheets have a length or width dimension of between 10 nm and 500 nm.

It may be that greater than 40% (e.g. greater than 50%, or greater than 75%, greater than 80% or greater than 90%) of the nanosheets of an inorganic layered material have a thickness of from 1 to 10 molecular layers.

It may be that greater than 40% (e.g. greater than 50%, or greater than 75%, greater than 80% or greater than 90%) of the nanosheets have a thickness of from 1 to 7 molecular layers. Thus, it may be that greater than 20% of the nanosheets have a thickness of 1 molecular layer. These statements apply particularly to nanosheets of graphene.

It may be that greater than 40% (e.g. greater than 50%, or greater than 75%, greater than 80% or greater than 90%) of the nanosheets have a thickness of from 1 to 6 molecular layers. Thus, it may be that greater than 40% (e.g. greater than 50%, or greater than 75%, greater than 80% or greater than 90%) of the nanosheets have a thickness of from 4 to 6 molecular layers. These statements apply particularly to nanosheets of transition metal dichalcogenides.

The concentration of nanosheets in the aqueous vehicle may be within the range of 0.01 to 5 mg/ml. More typically, the concentration of nanosheets is within the range of 0.01 to 1 mg/ml. Even more typically, the concentration of nanosheets is within the range of 0.01 to 0.5 mg/ml.

Suitably, the concentration of nanosheets in the aqueous vehicle is greater 0.01 mg/ml, and preferably greater than 0.5 mg/ml.

It may be that greater than 50% by weight (e.g. greater than 75% by weight, greater than 90% or greater than 98%) of the two-dimensional inorganic compound have a diameter between 50 and 750 nm. It may be that greater than 50% by weight (e.g. greater than 75% by weight, greater than 90% or greater than 98%) of the particles have a diameter of less than 500 nm. Thus, it may be that greater than 50% by weight (e.g. greater than 75% by weight, greater than 90% or greater than 98%) of the particles have a diameter between 100 and 500 nm.

It may be that greater than 50% by weight (e.g. greater than 75% by weight, greater than 90% or greater than 98%) of the two-dimensional inorganic compound have a thickness of from 1 to 10 molecular layers.

It may be that greater than 50% by weight (e.g. greater than 75% by weight, greater than 90% or greater than 98%) of the two-dimensional inorganic compound has a thickness of from 1 to 5 molecular layers. Thus, it may be that greater than 50% by weight (e.g. greater than 75% by weight, greater than 90% or greater than 98%) of the two-dimensional inorganic compound has a thickness of from 1 to 3 molecular layers. These statements apply particularly to particles of h-BN.

It may be that greater than 50% by weight (e.g. greater than 75% by weight, greater than 90% or greater than 98%) of the two-dimensional inorganic compound has a thickness of from 3 to 8 molecular layers. Thus, it may be that greater than 50% by weight (e.g. greater than 75% by weight, greater than 90% or greater than 98%) of the two-dimensional inorganic compound has a thickness of from 4 to 6 molecular layers. These statements apply particularly to particles of transition metal dichalcogenides.

The inorganic compound may be h-BN. Single layer h-BN is structurally similar to graphene, but unlike its carbon analogue, it is an insulator with a large band gap (~6 eV). This, added to unique features such as excellent chemical, mechanical properties, and thermal stability, allows using h-BN nanosheets (BNNS) in a variety of applications, such as component in nanodevices, solid lubricant, UV-light emitter and as insulating thermo-conductive filler in composites.

The inorganic compound may be a transition metal dichalcogen (e.g. $MoS_2$, $WS_2$, $MoTe_2$, $MoSe_2$ etc.).

The Aqueous Vehicle

The nanosheets of the present invention are dispersed in the aqueous vehicle. The term 'aqueous vehicle' can be understood to mean a liquid vehicle which contains water.

The aqueous vehicle may comprise greater than about 20% by volume of water. For example, the aqueous medium may contain more than 50% by volume water, e.g. more than 75% by volume water or more than 95% by volume water. Typically the aqueous vehicle will comprise 50 to 100% by volume of water.

The water content of the formulation as a whole will typically be greater than 20 wt. % relative to the total weight of the formulation. In an embodiment, the water content of the formulation is greater than 50 wt. % relative to the total weight of the formulation.

Typically, the water content will be within the range of greater than or equal to 20 wt. % to less than or equal to 99.9 wt. % relative to the total weight of the formulation. In an embodiment, the water content will be within the range of greater than 50 wt. % to less than or equal to 99.9 wt. % relative to the total weight of the formulation. In another embodiment, the water content is within the range of greater than or equal to 80 wt. % to less than or equal to 99.9 wt. % relative to the total weight of the formulation.

The 'aqueous vehicle' may also comprise other solvents. It may therefore comprise organic solvents which may or may not be miscible with water. Where the aqueous medium comprises organic solvents, those solvents may be immiscible or sparingly miscible and the aqueous medium may be an emulsion. The aqueous medium may comprise solvents which are miscible with water, for example alcohols (e.g. methanol and ethanol. The aqueous medium may comprise additives which may be ionic, organic or amphiphillic. Examples of such additives include surfactants, viscosity modifiers, pH modifiers, iconicity modifiers, dispersants.

In addition to the nanosheets, the aqueous vehicle may have other components dispersed within it, such as, for example, metallic particles and/or carbon nanotubes.

The aqueous medium may have any pH. The aqueous medium may have a pH in the range from 1 to 13. The aqueous medium may have a pH in the range from 1 to 7, e.g. in the range from 2 to 7 depending on the inorganic material.

Particularly (but not exclusively) where the polycyclic aromatic compound is Py-2SO$_3$, high concentrations of exfoliated inorganic layered compounds can be obtained at acidic pHs (e.g. from 1 to 7 or from 1 to 3 or about 2). Acidic pHs are particularly preferred where the two dimensional inorganic compound is h-BN.

The aqueous medium may have a pH in the range 5 to 9, e.g. from 6 to 8. Neutral pHs are particularly preferred where the two dimensional inorganic compound is a transition metal dichalcogenide.

Water-soluble Polyaromatic Compound

One of the components present in the aqueous vehicle is the water soluble polyaromatic compound.

The polycyclic aromatic compounds of the present invention have been found to be particularly efficient dispersants (i.e. they help form and maintain the dispersion of the nanosheets in the aqueous vehicle). The preferred way to prepare the formulations of the present invention is to form the nanosheets in situ within the aqueous vehicle defined herein by exfoliating larger particles of the bulk multi-layered inorganic material. The polyaromatic compounds of the present invention are particularly efficient at effecting the exfoliation of bulk inorganic layered materials to form the required nanosheets. The use of these compounds also has a beneficial effect on the loading of nanosheets that can be achieved in the ink formulation.

The presence of hydrophilic groups allows the polyaromatic compound to interact with the water as well as the nanosheets of the inorganic layered material. The polyaromatic compound acts as a dispersant, thereby stabilising the resultant dispersion of the nanosheets formed in the aqueous vehicle. Without wishing to be bound by any particular theory, it is believed that as the nanosheets are formed, for example by the application of energy (e.g. sonic energy) to exfoliate the bulk material, the polycyclic aromatic compounds penetrate between the layers of the inorganic material and non-covalently interact with the surfaces of the layers. It is believed that the polycyclic aromatic compound (e.g. pyrene) therefore aids the detachment of the nanosheets and then prevents them re-aggregating.

If the hydrophilic group is too large, (e.g. over 20 atoms in size) it is believed that the exfoliation yield will be reduced because of the smaller probability of intercalating between the layers.

The polycyclic aromatic compound may have a ring system which comprises from 2 to 10 fused benzene rings, the ring system being substituted with from 1 to 4 independently selected hydrophillic groups, each hydrophilic group consisting of less than 20 atoms. In an embodiment, the ring system may have from 2 to 8 or, more typically, 3 to 6 fused benzene rings. In a particular embodiment, the ring system has four fused benzene rings. Where the ring system contains three or more benzene rings (e.g. four benzene rings), it may be that the rings are not arranged linearly. Thus, the ring system may have at least one ring which is ortho- and peri-fused to two further rings respectively. In other words, it may be that at least one ring contains two atoms in common with each of two or more other rings.

The independently selected hydrophilic groups may consist of less than 10 atoms or they may consist of less than 6 atoms. The atoms in question may be independently selected from S, O, P, H, C, N, B and I. Exemplary hydrophilic groups include $SO_3H$, $SO_2H$, $B(OH)_2$, $CO_2H$, OH and $PO_3H$. Suitably, when the polyaromatic compound comprises four substituent groups, they are not all the same.

The polycyclic aromatic compound may be a salt and may therefore be a base addition salt. The above mentioned hydrophilic groups may therefore be $SO_3M$, $SO_2M$, $CO_2M$ and $PO_3M$, where M is a cation, e.g. a cation selected from $Na^+$, $K^+$, $Li^+$ and $NH_3^+$.

In a particular embodiment, the polycyclic aromatic compound may be a pyrene substituted with from 1 to 4 hydrophilic groups. It may be that the hydrophilic groups are selected from $SO_3M$ and OH. Specific examples include:

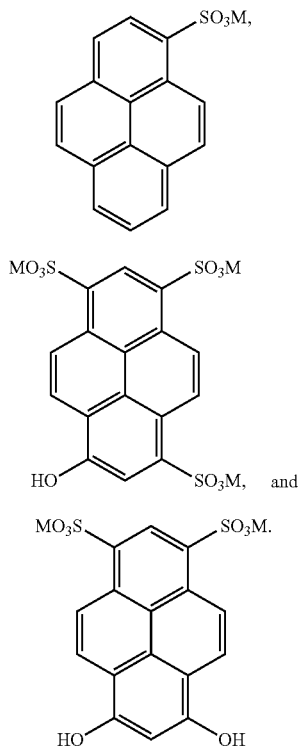

These exemplary pyrene sulfonic acid salts are dyes. They are thus readily available.

The amount of water soluble polyaromatic compound present in the formulations of the present invention is from $1\times10^{-4}$ mol/L to $200\times10^{-4}$ mol/L. More suitably, the amount of water soluble polyaromatic compound present in the formulations of the present invention is from $1.15\times10^{-4}$ mol/L to $66\times10^{-4}$ mol/L, even more suitably $1.15\times10^{-4}$ mol/L to $40\times10^{-4}$ mol/L and most suitably, $1.15\times10^{-4}$ mol/L to $33\times10^{-4}$ mol/L.

Viscosity Modifier

In order to render the formulation suitable for inkjet printing, the viscosity of the aqueous medium needs to be increased to within the range of 2 to 30 cPs, and more preferably within the range of 10-12 cPs. Accordingly, as the viscosity of water is 1 cPs, the formulation of the present invention suitably comprises a viscosity modifier as a component of the aqueous vehicle.

Any suitable viscosity modifier may be used in the formulations of the present invention. The viscosity modifier is suitably water miscible co-solvent. Examples of suitable viscosity modifiers include (and are not limited to) glycols (e.g. ethylene glycol, propylene glycol), ethers (e.g.ethylene glycol methyl ether), alcohols (e.g. 1-propanol), esters (ethyl lactate), ketones (e.g. methyl ethyl ketone (MEK)) and organo-sulphur compounds (e.g. sulfolane).

In a particular embodiment, the viscosity modifier is selected from ethylene glycol, propylene glycol and/or ethylene glycol methyl ether.

Suitably the viscosity modifier is a material which, when combined with water, forms an aqueous vehicle with a boiling point of below 200° C. More suitably, the viscosity modifier is a material which, when combined with water, forms an aqueous vehicle with a boiling point of below 180° C. or below 150° C. Suitably, the boiling point is not too low that the co-solvent readily evaporates at normal inkjet printing temperatures. In an embodiment, the viscosity modifier is a material which, when combined with water, forms an aqueous vehicle with a boiling point within the range of 80 to 200° C., more suitably 90 to 150° C.

The amount of viscosity modifier added is suitably sufficient to provide the final formulation with a viscosity of 2 to 30 cPs, or more preferably 10 to 12 cPs. Typically, the viscosity modifier is present in the formulations of the present invention at an amount of from 0.1 to 60 wt. %. Suitably, the viscosity modifier is present in the formulations of the present invention at an amount of from 0.5 to 50 wt. %. In an embodiment, the viscosity modifier is present in the formulations of the present invention at an amount of from 1 to 50 wt. %. In a further embodiment, the viscosity modifier is present in the formulations of the present invention at an amount of from 1.5 to 50 wt. %.

In an embodiment, the viscosity modifier is present in the formulations of the present invention at an amount of from 0.1 to 50 wt. % (e.g. 0.1 to 5 wt. %). In a further embodiment, the viscosity modifier is present in the formulations of the present invention at an amount of from 0.5 to 30 wt. % (e.g. 0.5 to 3 wt. %). In another embodiment, the viscosity modifier is present in the formulations of the present invention at an amount of from 1 to 30 wt. % (e.g. 1 to 3 wt. %). In a further embodiment, the viscosity modifier is present in the formulations of the present invention at an amount of from 1.5 to 10 wt. % (e.g. 1.5 to 2.5 wt. %). In a particular embodiment, where the inorganic material is graphene the amount of the viscosity modifier present is 2 wt. %.

Surface Tension Modifier

In order to render the formulation suitable for inkjet printing, the surface tension of the formulation needs to be adjusted to be within the range 20 to 50 mN/m and preferably within the range 28 to 45 mN/m and more preferably 28 to 35 mN/m. Accordingly, the formulation of the present invention suitably comprises a surface tension modifier as a component of the aqueous vehicle.

Water has a surface tension of 72 mN/m, so the surface tension modifier needs to reduce the surface tension of the formulation.

Any suitable surface tension modifier may be used in the formulations of the present invention. The surface tension modifier is suitably a water soluble surface active material. Examples of suitable materials include surfactants. Non-ionic surfactants are generally preferred. Any suitable non-ionic surfactant may be used. Typical examples include Triton, Tween, poloxamers, cetomacrogol 1000, cetostearyl alcohol, cetyl alcohol, cocamide DEA, monolaurin, nonidet P-40, nonoxynols, decyl glucoside, pentaethylene glycol monododecyl ether, lauryl glucoside, oleyl alcohol, and polysorbate.

In a particular embodiment, the surface tension modifier is Triton.

The amount of surface tension modifier present in the formulation is an amount sufficient to provide the final formulation with a surface tension of 20 to 50 mN/m, preferably 28 to 45 mN/m, and more preferably between 28 and 35 mN/m.

Typically, the surface tension modifier is present in the formulations of the present invention at an amount of from 0.01 to 2 wt. %. Suitably, the surface tension modifier is present in the formulations of the present invention at an amount of from 0.05 to 1 wt. %. In an embodiment, the surface tension modifier is present in the formulations of the present invention at an amount of from 0.1 to 1 wt. %. In a further embodiment, the surface tension modifier is present in the formulations of the present invention at an amount of from 0.25 to 0.75 wt. %. In a particular embodiment, the amount of the surface tension modifier present is 0.5 wt. %.

Processes of the Invention

As hereinbefore discussed, the present invention further provides a method of preparing an ink formulation as defined herein.

The inventors have found that enhanced loadings of nanosheets in the ink formulation can be obtained by forming the nanosheets in situ within the aqueous vehicle of the formulation. The nanosheets can be formed by exfoliating a source of the bulk multi-layered inorganic material (typically in the form of one or more large particles of the bulk material) in the pre-formed aqueous vehicle.

Thus, the present invention provides a process for the preparation of an ink formulation as defined in the first aspect of the invention, the process comprising:

a) providing multi-layered bulk inorganic material (e.g. particles of the inorganic material) in an aqueous vehicle as defined herein;
b) subjecting the multilayered particles of the inorganic material in the aqueous vehicle to energy to obtain an aqueous dispersion of nanosheets in the aqueous vehicle, wherein greater than 50% of the nanosheets comprise less than ten layers of the an inorganic layered material; and
c) when the dispersion obtained in step b) also comprises multilayered particles of the inorganic layered material, the method optionally further comprises the step of reducing the amount of multilayered particles of the inorganic layered material in the suspension.

Suitably, the aqueous vehicle is prepared by dissolving the water-soluble polyaromatic compound(s), the viscosity modifier(s) and the surface tension modifier(s) in the water. The bulk multi-layered inorganic material is immersed in the prepared aqueous vehicle in preparation for the exfoliation.

In this regard, the water soluble polycyclic aromatic compound component of the aqueous vehicle has been found to be particularly efficient at effecting the exfoliation of bulk inorganic layered materials to form thin (two-dimensional) nanosheets as defined herein. The presence of hydrophilic groups allows the polyaromatic compound to interact with the water and thus also act as a dispersant, thereby stabilising the resultant nanoparticulate suspension. It is believed that as the nanosheets form, polycyclic aromatic compounds intercalate and adsorb to the surface of the layers, thereby stabilise the nanosheets that are formed and preventing their re-aggregation.

The energy applied to convert the multi-layered particles into a dispersion of nanosheets in step (b) may be sonic energy. In an embodiment, the sonic energy is ultrasonic energy. Sonic energy may be delivered in using a bath sonicator or a tip sonicator. Alternatively, the energy may be a mechanical energy, e.g. shear force energy or girnding. The particles may be subjected to energy (e.g. sonic energy) for a length of time from 15 min to 1 week, depending on the properties and proportions (nanosheet diameter and thickness) desired. The particles may be subjected to energy (e.g. sonic energy) for a length of time from 1 to 4 days (in particular for inkjet printing where the size of the flakes must be smaller than the size of the printer nozzles). In an embodiment, the energy is sonic energy provided by immersing the formulation into a sonicator in step (b) which has a frequency of between 10 and 100 kHz (e.g. 35 kHz) and a power of 100 to 1000 Watts (e.g. 120 to 400 Watts).

The step of reducing the amount of multilayered particles in the suspension may comprise using a centrifuge. The centrifugation of the formulation prepared in step (b) of the process results in the deposition of some or all of the remaining multi-layered particles to leave a formulation that contains little or no remaining multi-layered particles. Following centrifugation, the formulation can be separated from the deposited multi-layered particles by simply removing the nanosheet dispersion from the pelleted multi-layered particles.

Applications

As hereinbefore discussed, the ink formulations of the present invention are useful for the inkjet printing of films or tracks as coatings or in the formation of printed electronics.

Thus, in another aspect, the present invention provides the use of an ink formulation as defined herein for the production of films and/or tracks.

Thus, if the inorganic material is graphene, then the film or track will be an electrically conductive film or track.

According to a further aspect, the present invention provides a film and/or track prepared by the inkjet printing of an ink formulation as defined herein onto a substrate.

The film and/or track is formed by the inkjet printing of the ink onto a substrate, followed by removing (preferably evaporation) of the liquid components.

Any suitable substrate may be used. Particular examples of suitable substrates include glass, plastic or ceramics.

According to a fifth aspect of the present invention, there is provided an electronic device or component comprising a film or track according to the fourth aspect of the present invention.

Examples of devices of components include antenna elements (such as RFID) devices, sensor elements, light emitting diodes, photovoltaic cells, screen tactile (touch panels) or thin film transistors (TFTs).

In particular, the electronic device may be or comprise a photovoltaic cell in which the light harvesting portion is a two-dimensional heterostructure comprising at least the following layers:

a first electrode layer which comprises graphene or modified graphene (e.g. doped graphene);
the thin films comprising a plurality of single layer or few-layered particles of a transition metal dichalcogenide; and
a second electrode layer;

wherein the layers are stacked sequentially to form a laminate structure and the or each thin film of transition metal dichalcogenide is situated between the first and the second electrode layer and the or each thin film of transition metal dichalcogenide layer is in electrical contact with both electrodes.

The second electrode layer may also comprise graphene. The transition metal dichalcogenide may be $MoS_2$ or $WS_2$.

The device may be or comprise a photodetector, the photodetector comprising:

a gate electrode;
a layer of graphene connected to a source electrode and a drain electrode; and the thin film comprising a plurality of single layer or few-layered particles of an inorganic layered material in contact with and situated between both the graphene layer and electrode and the gate electrode.

The inorganic layered material may be h-BN.

The electronic device may be a transistor comprising:

a source electrode;
a drain electrode; and
the thin film comprising a plurality of single layer or few-layered particles of an inorganic layered material in contact with and situated between both the source electrode and the drain electrode wherein at least one of the source electrode and drain electrode comprises graphene and the other electrode comprises a layer of a conductive material. It may be that both the source electrode and the drain electrode comprise graphene.

The thin film may comprise a plurality of single layer or few layer particles of BN. Alternatively, it may comprise a plurality of single layer or few layer particles of a transition metal dichalcogenide (e.g. $MoS_2$).

Where the device comprises a layer of graphene, that graphene layer may independently comprise a thin film of graphene flakes. Alternatively, that graphene layer may comprise a single crystal of graphene. Thus, the graphene may have been produced by mechanical exfoliation or by chemical vapour deposition.

The thin film may in fact comprise a plurality of thin films arising respectively from a plurality of individual deposition steps.

It may be that the or each thin film (e.g. of an inorganic material or of graphene) contains at least one polycyclic aromatic compound; wherein the or each polycyclic aromatic compound independently has a ring system which comprises from 2 to 6 fused benzene rings, the ring system being substituted with from 1 to 4 hydrophillic groups each independently consisting of less than 20 atoms. The polycyclic aromatic compound may not be a significant component of the thin film but it will still be present in a detectable amount.

The methodology described herein may further comprise one or more post-processing steps applied to the thin film or track. For example, the methodology described herein may comprise the step of washing the thin film or track (e.g. with water or an aqueous solution) to reduce the amount of the polycyclic aromatic compound present in the device. This step may remove all of the polycyclic aromatic compound but more typically small amounts of the polycyclic aromatic compound will remain in the thin film or track. Alternatively, or in addition, the thin film or track may be annealed by heating the film/track to an elevated temperature for a specified period of time.

The graphene-containing inks defined herein, and/or the resultant tracks formed by these inks, possess high thermal conductivities, which means that they could be used in thermal management applications. Suitably, the graphene inks, and/or the tracks derived therefrom, possess thermal conductivities within the range 30-100 W/mK, e.g. within the range 50-80 W/mK. Certain other inks of the present invention, such as, for example, inks comprising BN may also possess good thermal conductivity properties.

EXAMPLES

Materials 1-pyrenesulfonic acid sodium salt (1-PSA; Py-1SO$_3$, >97.0% (HPLC)), ethylene glycol methyl ether and Triton were all purchased from Sigma-Aldrich.

Graphite flakes were purchased from Bran Well UK, Grade: 99.5.

Unless otherwise stated, other reagents were of analytical grade and were used as received. All aqueous solutions were prepared with ultra-pure water (18.2 MΩ) from a Milli-Q Plus system (Millipore).

Preparation of Inkjet Printable Formulations

Graphene Formulations

Example 1

30 mg of graphite and 1 mg of 1-PSA were placed in a glass vessel and 10 ml of an aqueous solution comprising 4.75 g of deionised water, 0.2 g of ethylene glycol methyl ether and 0.05 g Triton was added.

The glass vessel was then immersed in a sonic bath and sonicated for 2 hours.

The resultant dispersion was centriguged at 1000 rpm for 20 minutes (to remove the remaining graphite) and then at 3500 rpm for 20 minutes (to remove larger particles of graphene).

The formulation was then subject to sonication in a sonic bath for a further 46 hours.

Using this technique, separate formulations containing around 0.105 mg/ml, 0.526 mg/ml and 0.138 mg/ml of graphene nanopartilces were prepared.

The surface tension of the formulation was measured as 32 mN/m using standard techniques.

The stability of the formaulation was assessed by measuring the concentration of the suspension by absorption spectroscopy once every day for one week after sonication and then once/week for the next 2 weeks. A strong decrease in concentration with formation of an aggregate at the bottom of the bottle is a clear fingerprint of the limited stability of the suspensions. The formulations prepared in this example all had good stability for at least three weeks.

The formulation of example 1 was also used for inkjet printing. A Dimatix DMP-2800 inkjet printer (Fujifilm Dimatix, Inc., Santa Clara, USA) was used for the printing. This printer can create and define patterns over an area of about 200×300 mm and handle substrates up to 25 mm thick being adjustable in the Z direction. The temperature of the vacuum platen, which secures the substrate in place, can be adjusted up to 60° C. Additionally, a waveform editor and a drop-watch camera system allows manipulation of the electronic pulses to the piezo jetting device for optimization of the drop characteristics as it is ejected from the nozzle. The nozzle plate consists of a single row of 16 nozzles of 23 μm diameter spaced 254 μm with typical drop size of 10 pL. The printer also has the possibility of varying the distance between two consecutive droplets, the so-called dot spacing, parameter that has an effect in the continuity, width and thickness of printed features. Using this printer, the ink formulation is added to the ink cartridge with stirring. The head of the cartridge (where there are the nozzles) is then closed. The cartridge was positioned in the printer and allowed to stand for 15 minutes to allow any bubbles to dissipate. Printing was carried out after 15 minutes.

Figure 1B:
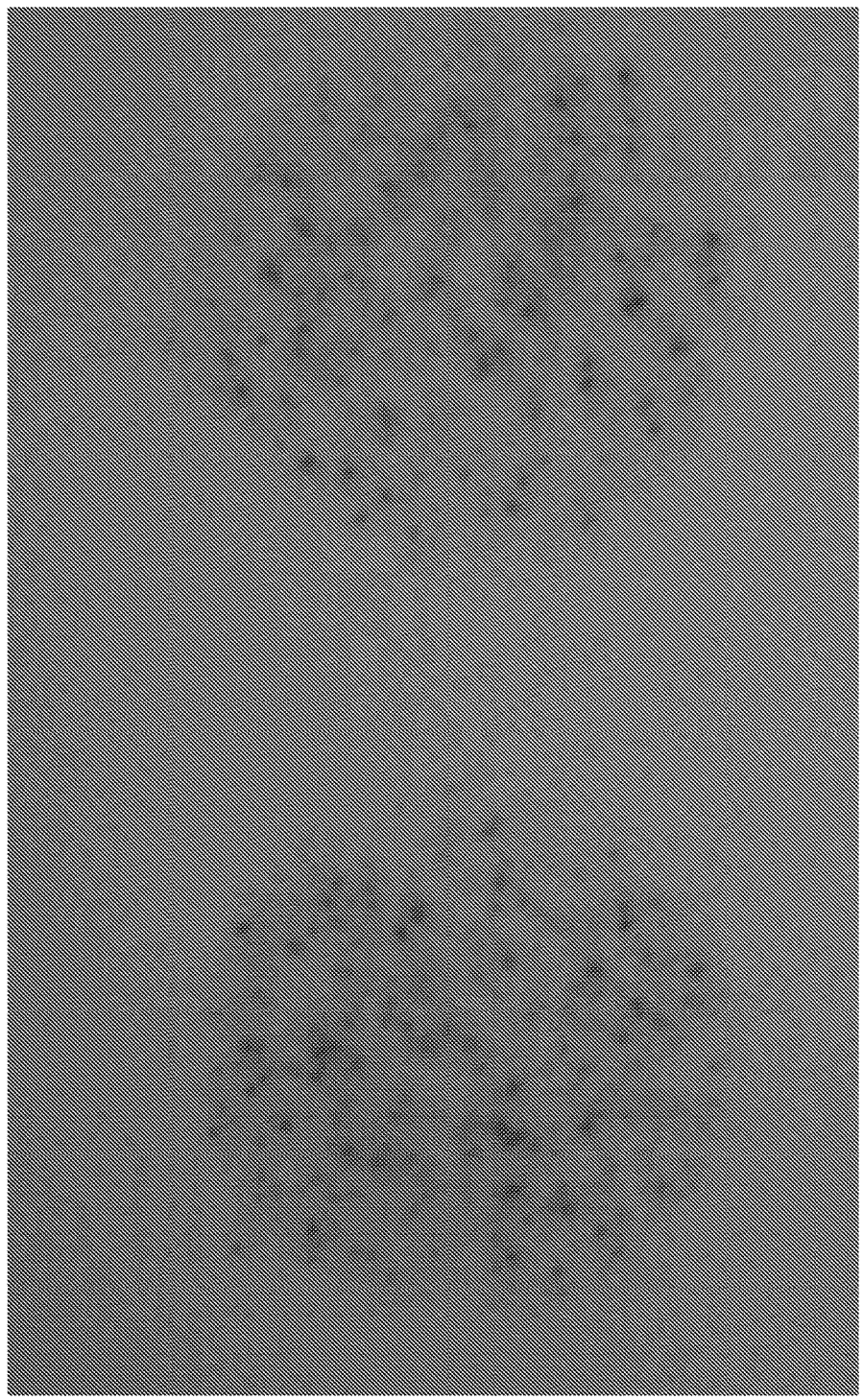
FIG. 1B is a digital photograph showing printed dots formed by the inkjet printing of the formulation prepared in Example 1 herein.

The resultant formulation had good stability for at least 3 weeks and could be inkjet printed (see FIGS. 1A and 1B).

Example 2

The following quantities of reagents were added to a 12 mL glass vial:

$H_2O$-9.5 g;
Ethylene glycol-0.4 g;
Triton-x100-0.5 mg;
Graphite (flakes>100 μm)-30 mg; and
1-pyrenesulfonic acid sodium salt-1.2 mg.

The glass vial was then stoppered and placed into a 600 W bath sonicator for 10 hours.

The solution was centrifuged at 1000 rpm for 20 minutes and the top ⅔ collected.

The collected solution was then centrifuged at 3500 rpm for 20 mins and the top ⅔ collected. The collected material was placed into a 600 W bath sonicator for a further 48 hours.

UV/Vis was then conducted from 800-200 nm using a Cary 5000 UV-Vis-Near IR spectrometer with the absorption coefficient $\alpha_{660}$=2460 L g$^{-1}$ m$^{-1}$ to determine graphene concentration.

Using this technique, a formulation containing around 0.193 mg/mL of graphene nanopartilces was prepared.

The surface tension of the formulation was measured as 38.82±4.15 mN/m using a KRUSS DSA-100 recording the pendant drop profile.

A Fujifilm Dimatix DMP-2800 printer was used to print the inks, using a drop spacing of 40 μm and the pattern coordinates detailed in Table 1 and FIG. 2B.

Figure 2A:
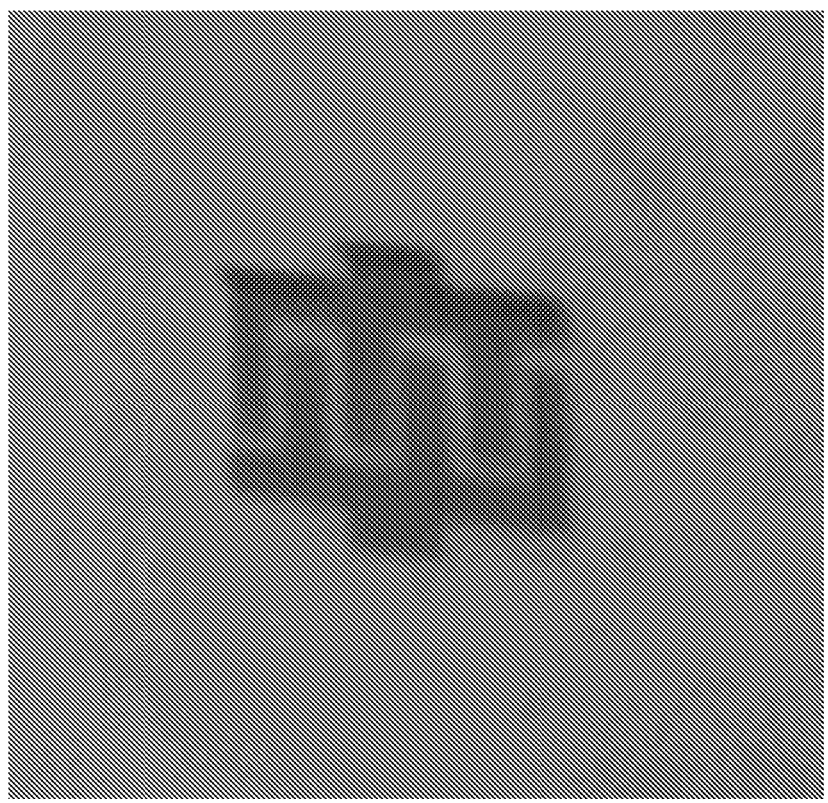
FIG. 2A is a digital photograph showing a printed comb formed by the inkjet printing of the formulation prepared in Example 2 herein.
Figure 2B:
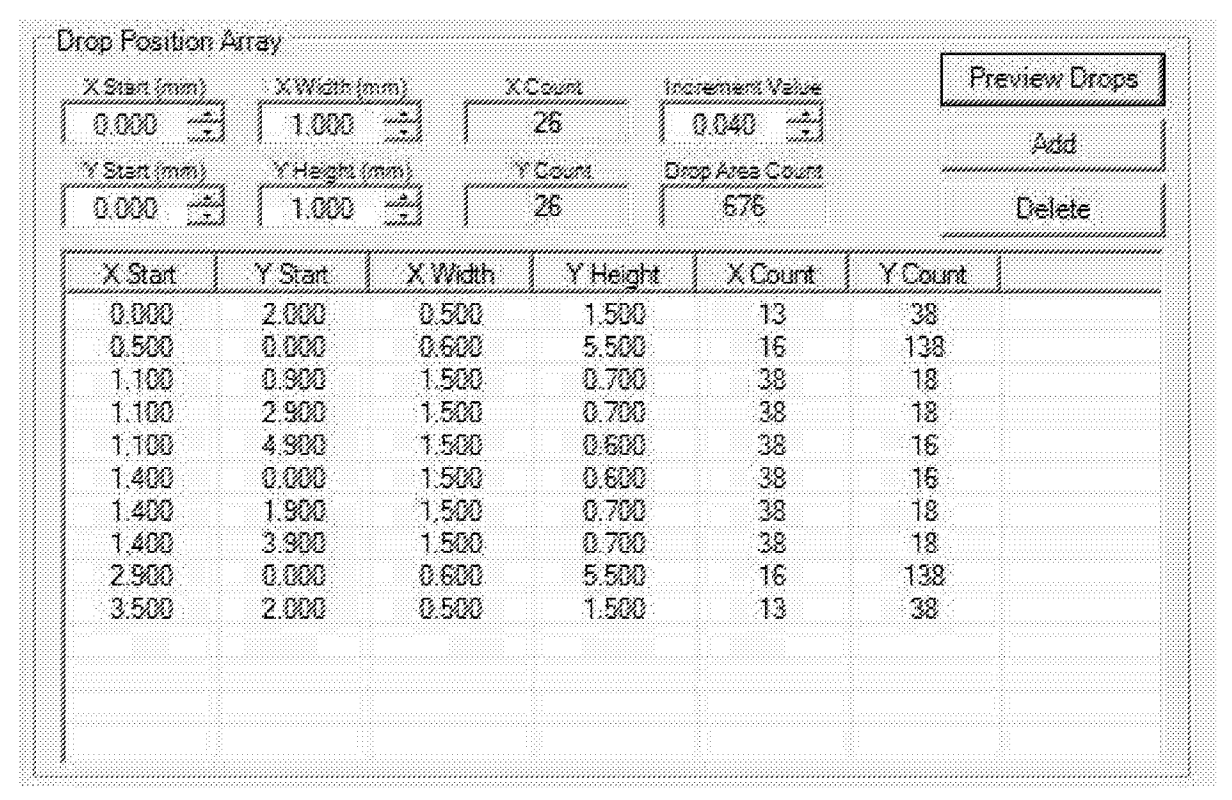

The resultant formualtion (example 2) had good stability and could be inkjet printed (see FIG. 2A).

TABLE 1 the pattern coordinates used to print the comb pattern displayed in FIG. 2A

Drop Position Aray:

| X Start (mm): | X Width (mm): | X Count: | Incement Value: |
|---|---|---|---|
| 0.000 | 1.000 | 26 | 0.040 |

| Y Start (mm): | Y Height (mm): | Y Count: | Drop Area Count: |
|---|---|---|---|
| 0.000 | 1.000 | 26 | 676 |

| X Start | Y Start | X Width | Y Height | X Count | Y Count |
|---|---|---|---|---|---|
| 0.000 | 2.000 | 0.500 | 1.500 | 13 | 38 |
| 0.500 | 0.000 | 0.600 | 5.500 | 16 | 138 |
| 1.100 | 0.900 | 1.500 | 0.700 | 38 | 18 |
| 1.100 | 2.900 | 1.500 | 0.700 | 38 | 18 |
| 1.100 | 4.900 | 1.500 | 0.600 | 38 | 16 |
| 1.400 | 0.000 | 1.500 | 0.600 | 38 | 16 |
| 1.400 | 1.900 | 1.500 | 0.700 | 38 | 18 |
| 1.400 | 3.900 | 1.500 | 0.700 | 38 | 18 |
| 2.900 | 0.000 | 0.600 | 5.500 | 16 | 138 |
| 3.500 | 2.000 | 0.500 | 1.500 | 13 | 38 |

A Fujifilm Dimatix DMP-2800 printer was used to print the ink on PEL™ to form lines from 90 to 5 passes. No annealing was performed. Electrical measurements were conducted using a Keithley 2400 sourcemeter.

Figure 3A:
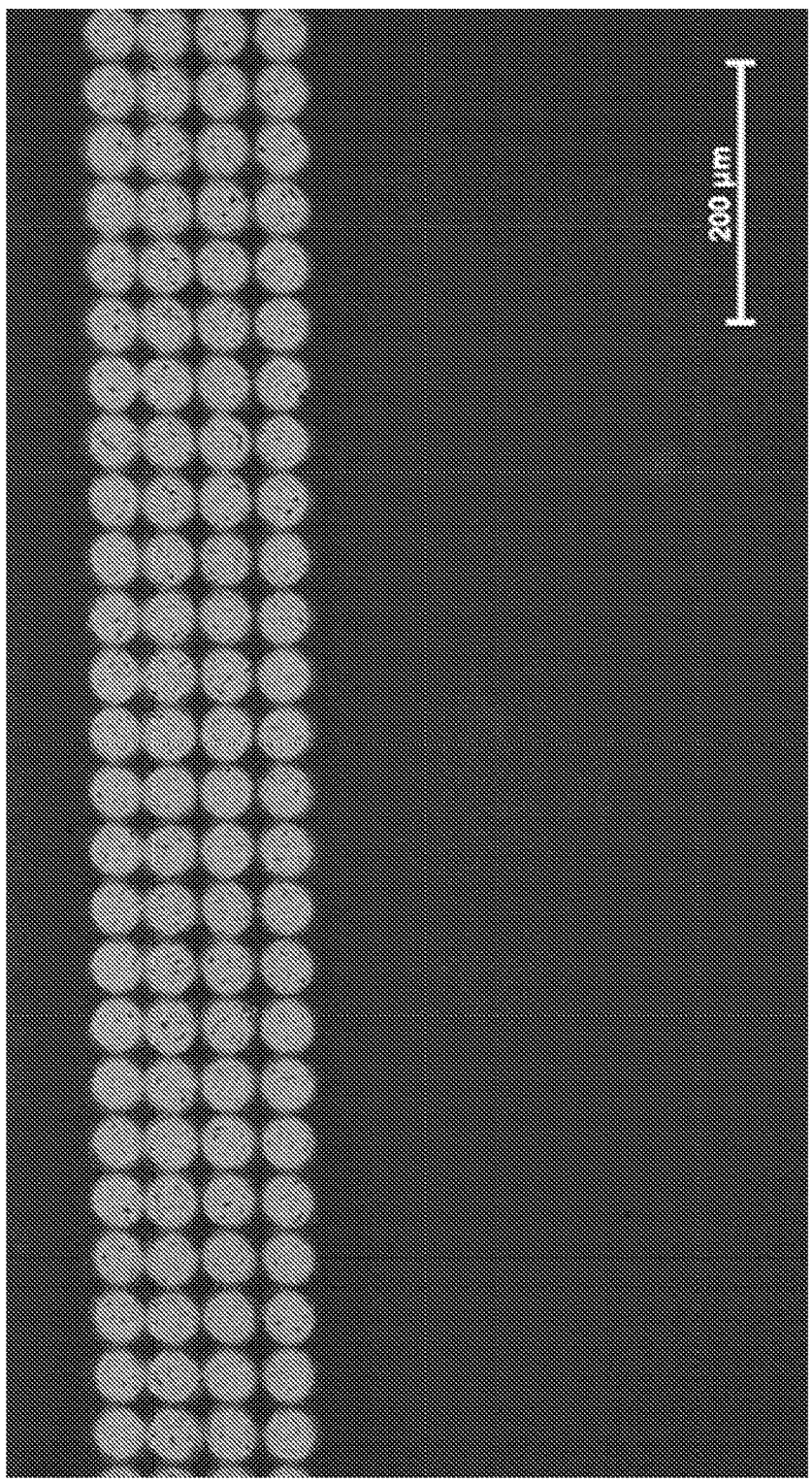
FIG. 3A is a digital photograph showing a printed line that is 8mm long and 4 drops (168 μm) wide, which was printed with 90 passes on PEL™ with a drop spacing of 45 μm as described in Example 2 herein.

A line 8 mm long and 4 drops (168 μm) wide was printed with 90 passes and drop spacing of 45 μm. Sheet resistance was 922 kΩ/□, (see FIG. 3A).

Figure 3B:
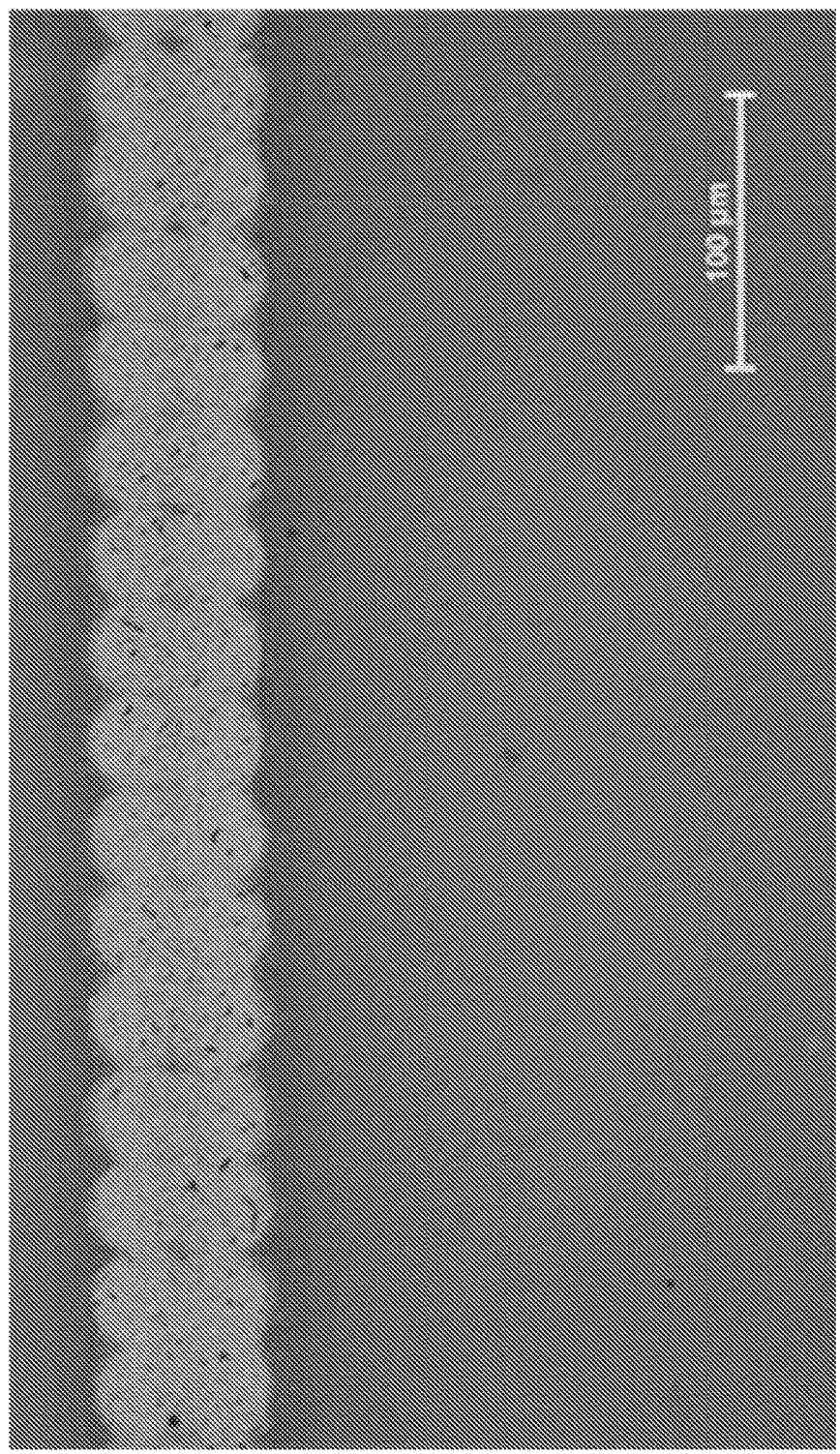
FIG. 3B is a digital photograph showing a printed line that is 8 mm long and 2 drops (168 μm) wide, which was printed with 60 passes on PELTM with a drop spacing of 35 μm as described in Example 2 herein.

A line 8 mm long and 2 drops (66 μm) wide was printed with 60 passes and drop spacing of 35 μm. Sheet resistance was 163 kΩ/□, (see FIG. 3B).

Lines 8 mm long and 2 drops (66 μm) wide were printed with 50, 40, 35 and 30 passes and drop spacing of 35 μm. Sheet resistances were 277 kΩ/□, 510 kΩ/□, 788 kΩ/□ and 1.48 MΩ/□ respectively.

A Fujifilm Dimatix DMP-2800 printer was used to print the ink on polyethylene terephthalate (PET) to form lines from 90 to 10 passes in increments of 10. No annealing was performed. Electrical measurements were conducted using a Keithley 2400 sourcemeter.

Lines 8 mm long and 2 drops wide were printed with 90, 80, 70, 60, 50, 40, 30, 20 and 10 passes and drop spacing of 35 μm.

Transmission data was collected using a Renishaw inVia confocal microscope with 514 nm laser and 100×0.6 NA lens.

Figure 4:
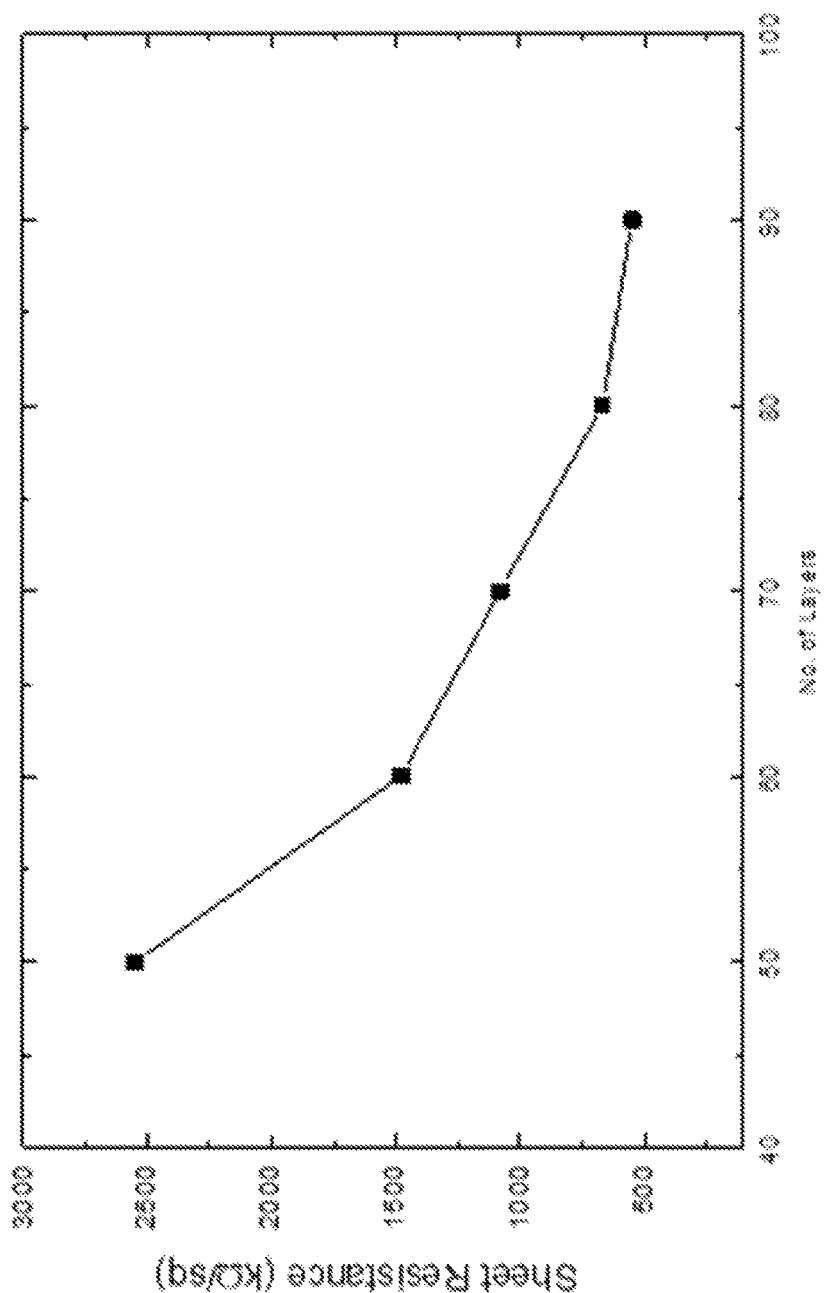
FIG. 4 shows a plot of sheet resistance (kΩ/□) versus the number of layers for lines printed on PET, as described in Example 2.

Sheet resistance increased from 549 kΩ/□ for 90 passes to 2.54 MΩ/□ for 50 passes, FIG. 4.

Figure 5:
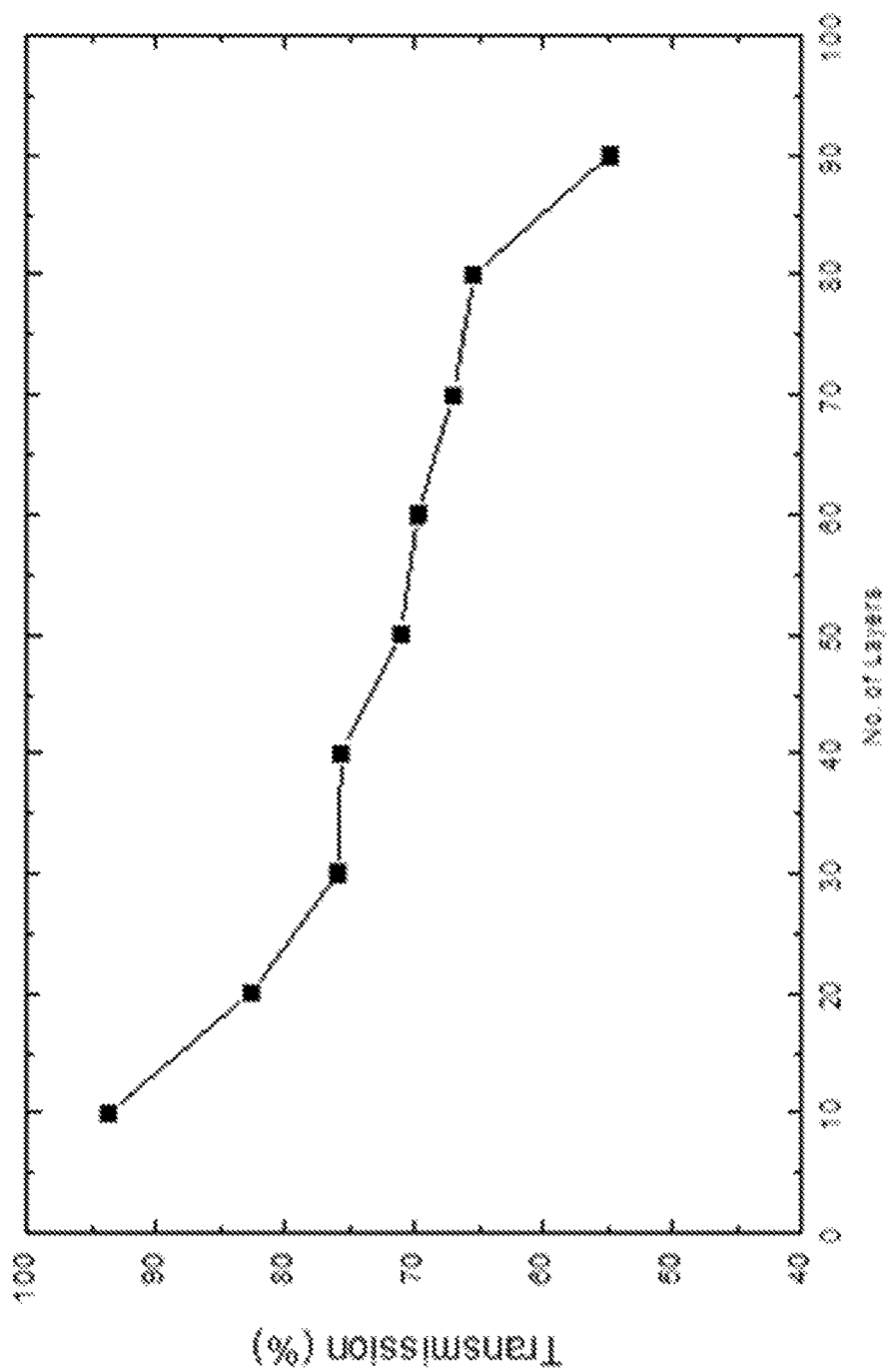
FIG. 5 shows a plot of transmission (%) versus the number of layers for lines printed on PET, as described in Example 2.

Transmission at 514 nm increased from 54% for 90 passes to 94% for 10 passes, FIG. 5.

A Fujifilm Dimatix DMP-2800 printer was used to print the ink on SiO$_2$ to form lines. Annealing was performed at 300° C. for 1 hour under Argon atmosphere. Electrical measurements were conducted using a Keithley 2400 sourcemeter before and after annealing.

Lines 8 mm long and 2 drops wide were printed with 60 and 20 passes and drop spacing of 30 μm. Sheet resistance obtained after 60 passes was 711 kΩ/□ before annealing. Sheet resistances were 26.7 kΩ/□ and 42.4 kΩ/□ for 60 and 20 passes respectively after annealing.

Lines 8 mm long and 2 drops wide were printed with 100 and 60 passes and drop spacing of 35 μm. Sheet resistance obtained after 100 passes was 1.07 MΩ/□ before annealing. Sheet resistances were 23.2 kΩ/□ and 201 kΩ/□ for 100 and 20 passes respectively after annealing.

Example 3

MOS$_2$ Formulation

The following quantities of reagents were added to a glass pot:

H$_2$O-47.5 g;
Ethylene glycol-2.0 g;
Triton-x100-3 mg;
MoS$_2$ (flakes ~2 μm)-150 mg; and
1-pyrenesulfonic acid sodium salt-6 mg.

The glass pot was then stoppered and placed into a 600 W bath sonicator for 72 hours.

The solution was centrifuged at 1000 rpm for 20 minutes and the top ⅔ collected.

The collected solution was then centrifuged at 3500 rpm for 20 mins and the top ⅔ collected. The collected material was placed into a 600 W bath sonicator for a further 48 hours.

UV/Vis was then conducted from 800-200 nm using a Cary 5000 UV-Vis-Near IR spectrometer with the absorption coefficient $\alpha_{672}$=3400 L g$^{-1}$ m$^{-1}$ to determine MoS$_2$ concentration.

Using this technique, a formulation containing around 0.292 mg/mL of MoS$_2$ nanopartilces was prepared.

The surface tension of the formulation was measured as 40.14±2.96 mN/m using a KRUSS DSA-100 recording the pendant drop profile.

A Fujifilm Dimatix DMP-2800 printer was used to print the inks, using a drop spacing of 40 μm and the pattern coordinates detailed in Table 2 and FIG. 6B.

Figure 6A:
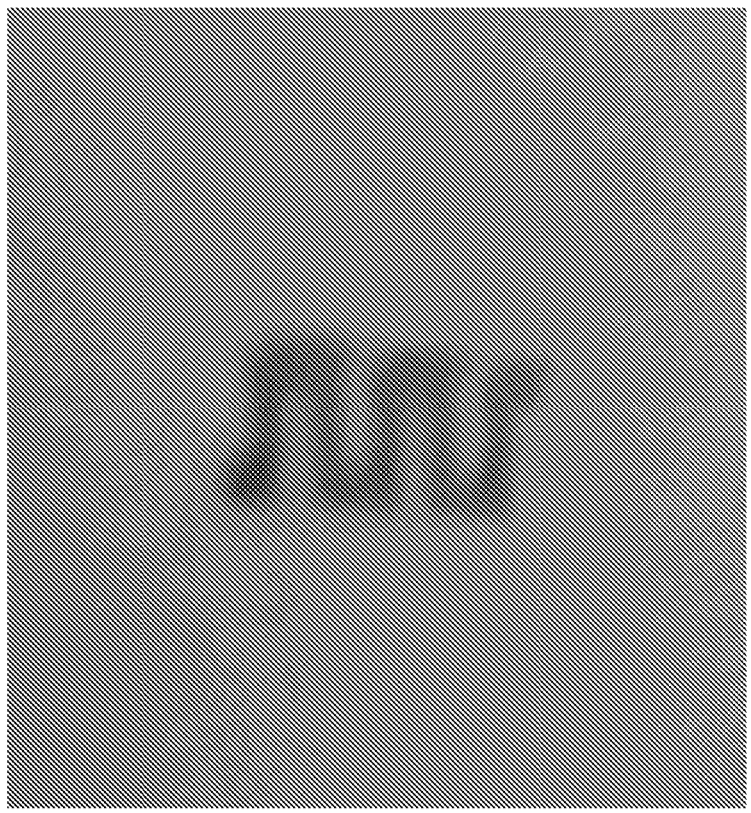
FIG. 6A is a digital photograph showing a printed comb electrode formed by the inkjet printing of the formulation prepared in Example 3 herein.
Figure 6B:
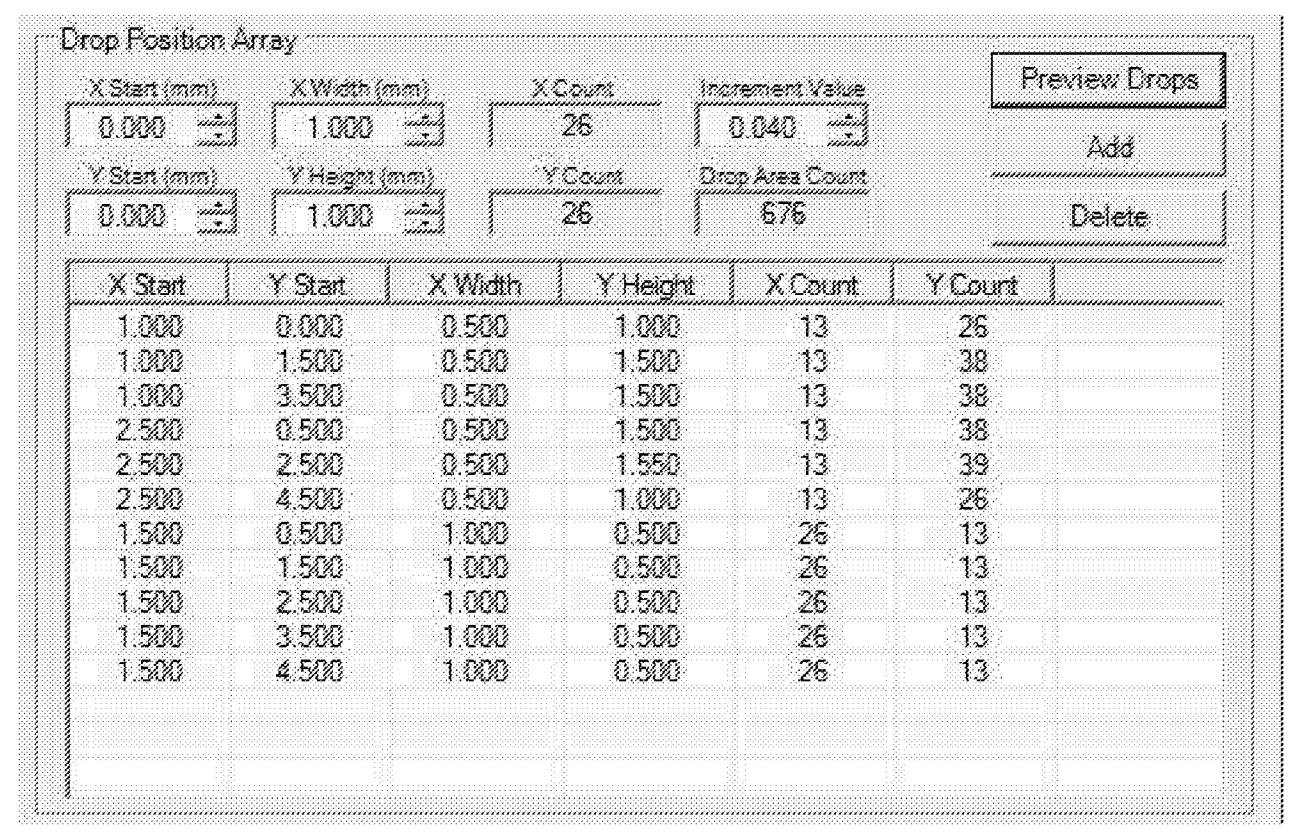

The resultant formualtion (example 3) had good stability and could be inkjet printed (see FIG. 6A).

TABLE 2 the pattern coordinates used to print the zigzag pattern displayed in FIG. 6A

Drop Position Aray:

| X Start (mm): | X Width (mm): | X Count: | Incement Value: |
|---|---|---|---|
| 0.000 | 1.000 | 26 | 0.040 |

| Y Start (mm): | Y Height (mm): | Y Count: | Drop Area Count: |
|---|---|---|---|
| 0.000 | 1.000 | 26 | 676 |

| X Start | Y Start | X Width | Y Height | X Count | Y Count |
|---|---|---|---|---|---|

TABLE 2-continued the pattern coordinates used to print the zigzag pattern displayed in FIG. 6A

| | | | | | |
|---|---|---|---|---|---|
| 1.000 | 0.000 | 0.500 | 1.000 | 13 | 26 |
| 1.000 | 1.500 | 0.500 | 1.500 | 13 | 38 |
| 1.000 | 3.500 | 0.500 | 1.500 | 13 | 38 |
| 2.500 | 0.500 | 0.500 | 1.500 | 13 | 38 |
| 2.500 | 2.500 | 0.500 | 1.500 | 13 | 39 |
| 2.500 | 4.500 | 0.500 | 1.000 | 13 | 26 |
| 1.500 | 0.500 | 1.000 | 0.500 | 26 | 13 |
| 1.500 | 1.500 | 1.000 | 0.500 | 26 | 13 |
| 1.500 | 2.500 | 1.000 | 0.500 | 26 | 13 |
| 1.500 | 3.500 | 1.000 | 0.500 | 26 | 13 |
| 1.500 | 4.500 | 1.000 | 0.500 | 26 | 13 |

Figure 7:
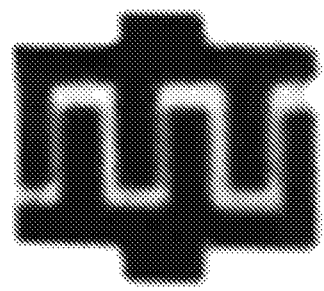
FIG. 7 shows a comb electrode on PEL™ formed from 30 layers of a printed ink formulation of example 3 ($MoS_2$) and 90 layers of a graphene ink formulation of Example 2 (see Example 3 for details)

30 layers were printed to form the zigzag comb electrode pattern on PEL™ (FIG. 6A). The graphene pattern described in Example 2 above was printed on top with 90 layers to form an in-plane photodetector (see FIG. 7).

Figure 8A:
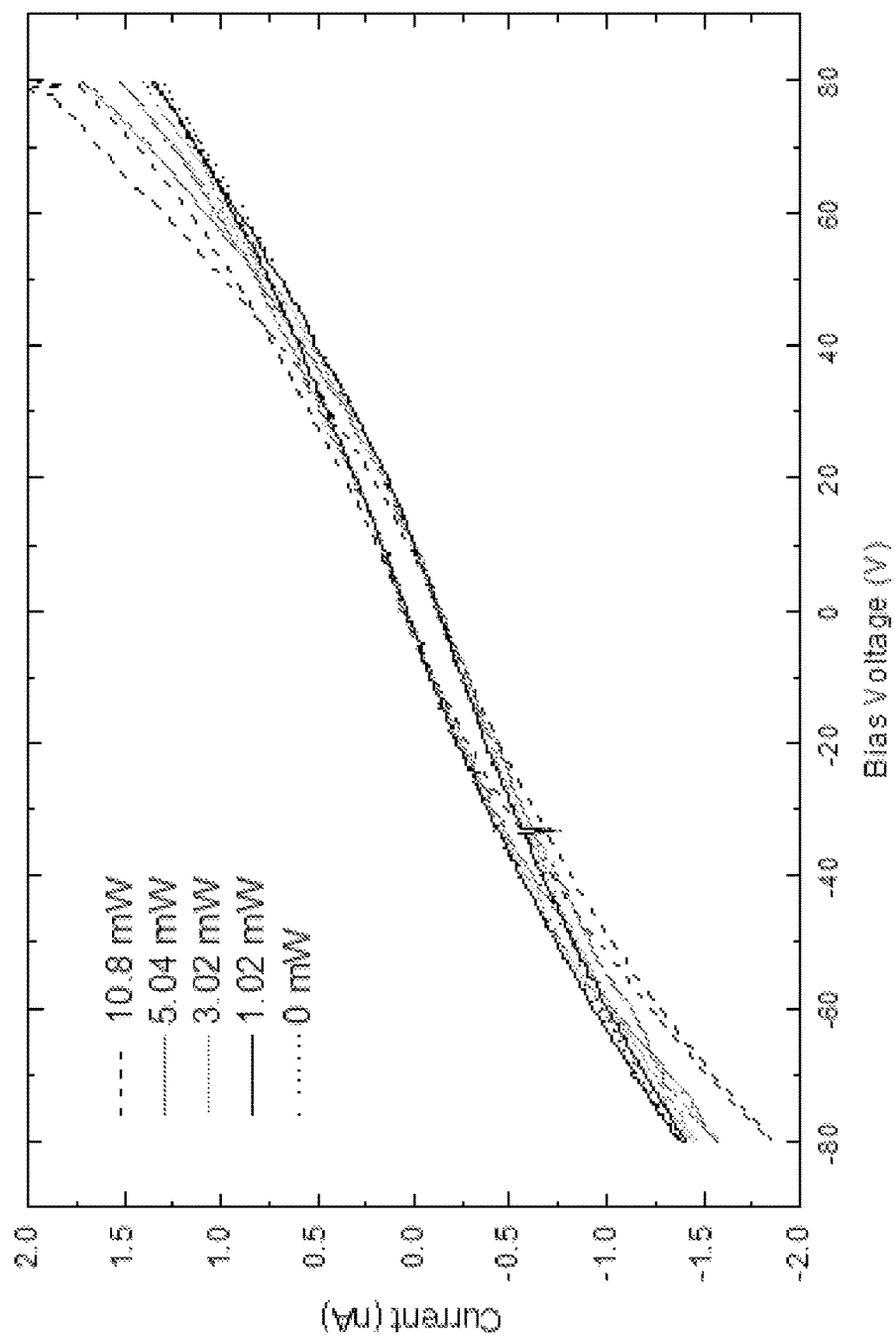
FIG. 8A shows a plot of voltage (V) versus current (A) for the comb electrode shown in FIG. 7 and described in Example 3.
Figure 8B:
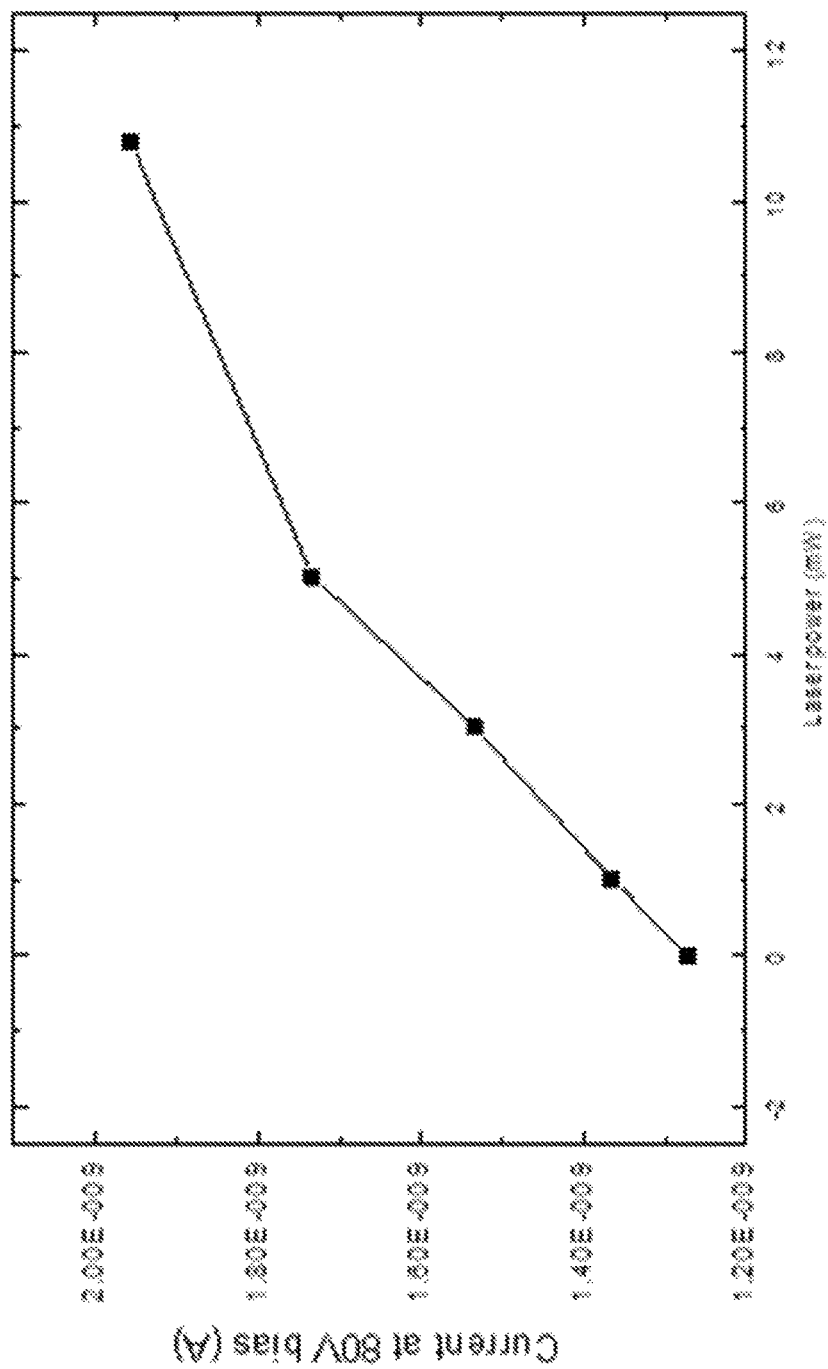
FIG. 8B shows a plot of laser power (mW) versus current at 80V bias (A) for the comb electrode shown in FIG. 7 and described in Example 3.
Figure 9A:
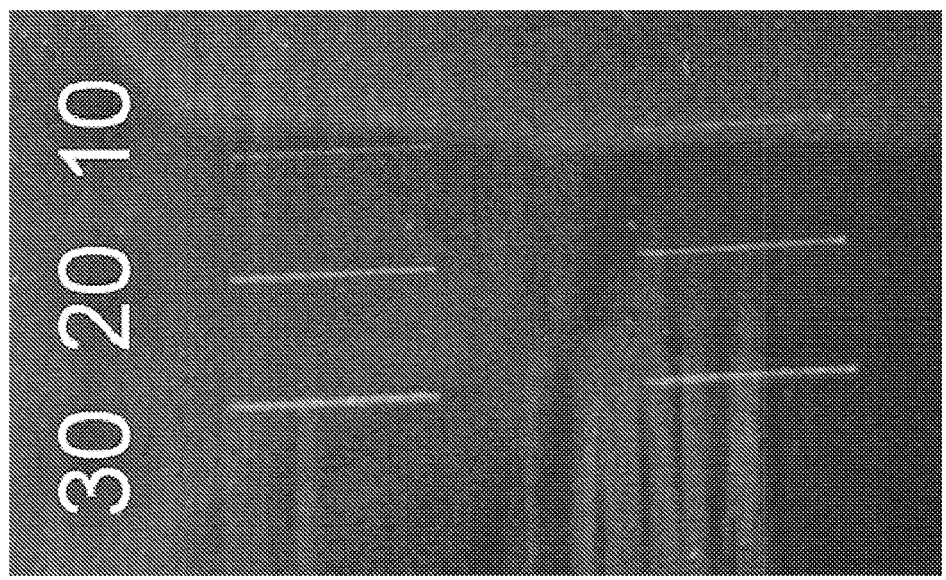
FIG. 9A is a digital photograph showing a series of lines, under natural light, formed by the inkjet printing of the formulation prepared in Example 4 herein, onto polyethylene terephalate (PET) plastic after 10, 20 and 30 passes from right to left.
Figure 9B:
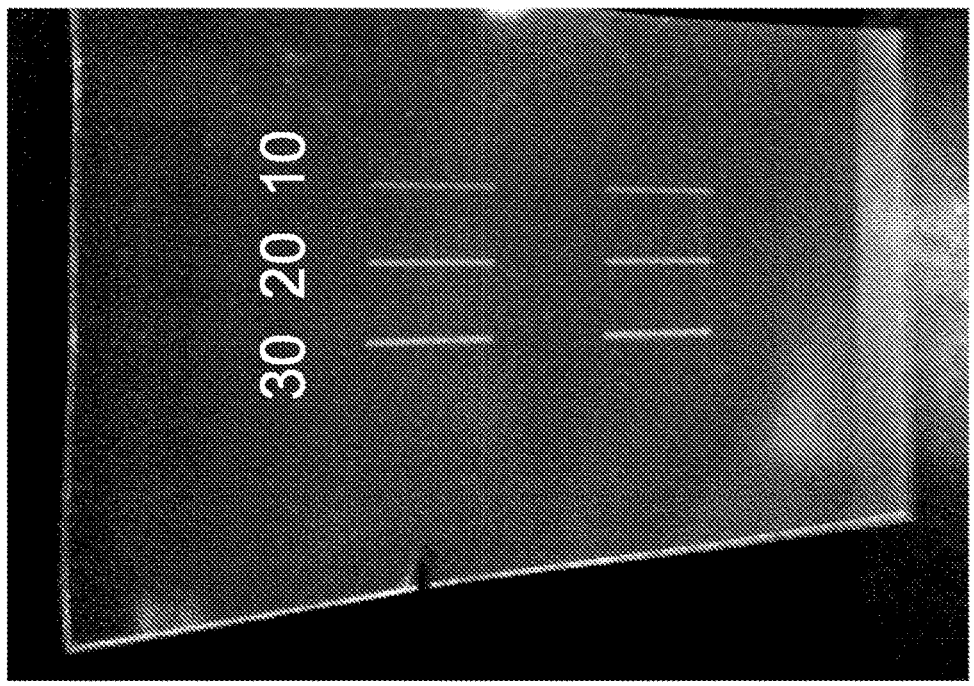
FIG. 9B is a digital photograph showing a series of lines, under UV light, formed by the inkjet printing of the formulation prepared in Example 4 herein, onto polyethylene terephalate (PET) plastic after 10, 20 and 30 passes from right to left.
Figure 9C:
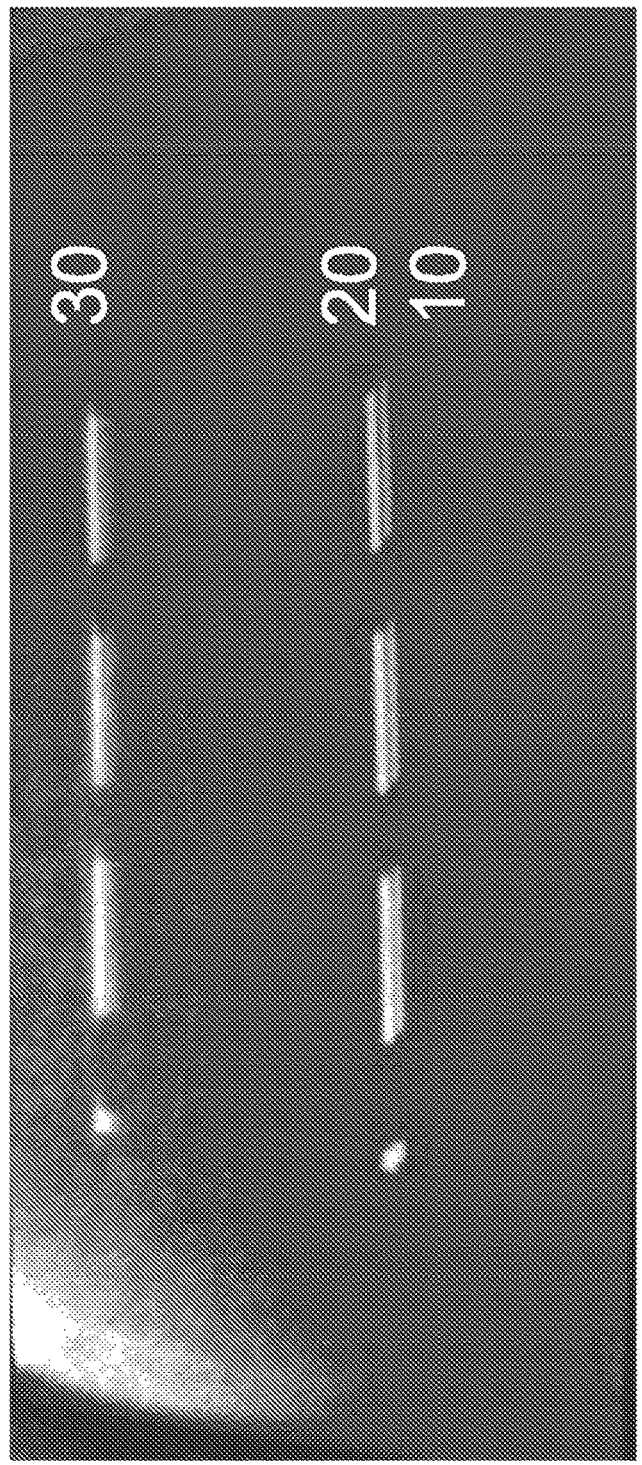
FIG. 9C is a digital photograph showing a series of lines, under UV light, formed by the inkjet printing of the formulation prepared in Example 4 herein, onto PEL™ paper after 10, 20 and 30 passes from bottom to top.

Photocurrent measurements were conducted using a Keithley 2400 sourcemeter and a WiTEC Alpha 300 confocal microscope with 514 nm laser for illumination. Power densities of 54 mW cm$^{-2}$ (10.8 mW), 25.2 mW cm$^{-2}$ (5.04 mW), 15.1 mW cm$^{-2}$ (3.02 mW) and 5.1 mW cm$^{-2}$ (1.02 mW) were used and current-voltage curves recorded to a maximum 80V bias voltage (see FIGS. 8A & 8B).

Example 4

Hexagonal Boron Nitride (h-BN) Formulation

The following quantities of reagents were added to a glass pot:

$H_2O$-8 g;
Ethylene glycol-2.0 g;
Triton-x100 -0.6 mg;
h-BN (flakes~1 μm)-30 mg ; and
1-pyrenesulfonic acid sodium salt-1 mg.

The glass pot was then stoppered and placed into a 600 W bath sonicator for 48 hours.

The solution was centrifuged at 1000 rpm for 20 minutes and the top ⅔ collected.

The collected solution was then centrifuged at 3500 rpm for 20 mins and the top ⅔ collected. The collected material was placed into a 600 W bath sonicator for a further 48 hours.

UV/Vis was then conducted from 800-200 nm using a Cary 5000 UV-Vis-Near IR spectrometer with the absorption coefficient $\alpha_{550}$=1000 L g$^{-1}$ m$^{-1}$ to determine h-BN concentration.

Using this technique, a formulation containing around 0.3 mg/mL of h-BN nanopartilces was prepared.

The surface tension of the formulation was measured as 41.67±3.11 mN/m.

A Fujifilm Dimatix DMP-2800 printer was used to print the inks. The substrate temperature was 40° C. and a drop spacing of 30 μm was used.

The resultant formulation (example 4) could be inkjet printed (see FIGS. 9A, 9B, 9C and 9D).

A Fujifilm Dimatix DMP-2800 printer was used to print the ink on $SiO_2$ to form lines with 1, 10, 20, 30, 40, 50 and 60 passes. 30 μm drop spacing and 40° C. substrate temperature were used. Thicknesses were measured using a Veeco Dektak 8 profilometer.

Figure 10A:
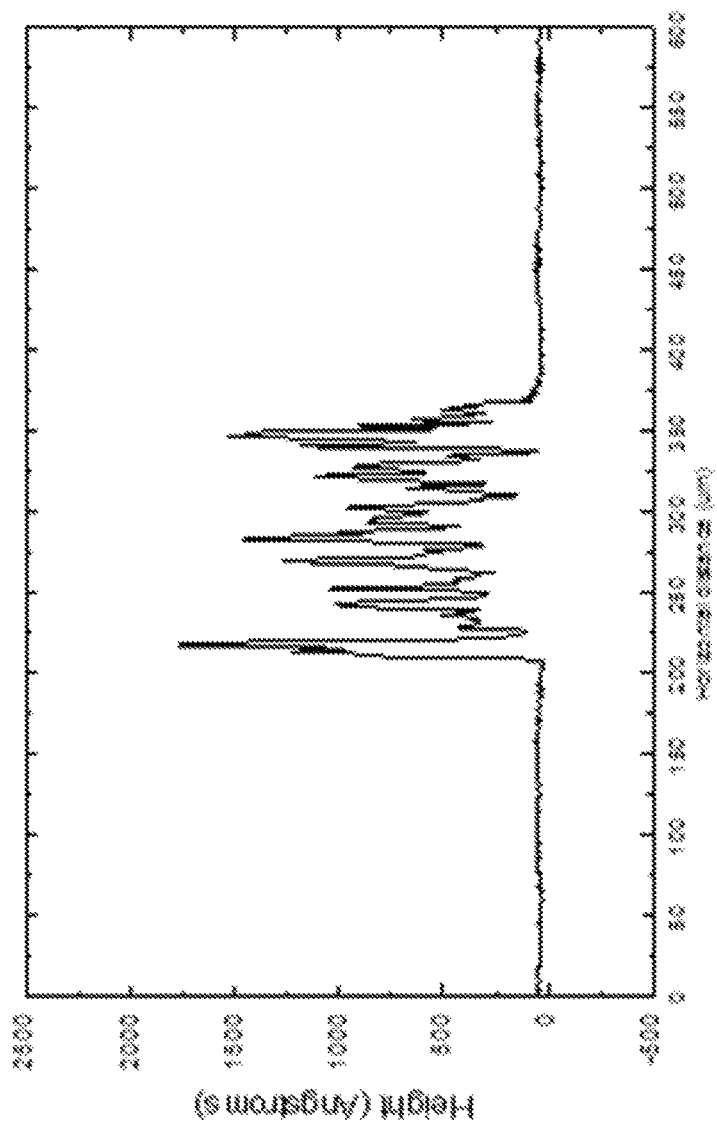
FIG. 10A shows the height profile a print line formed by printing 10 passes of the ink formulation described in Example 4 on $SiO_2$.
Figure 10B:
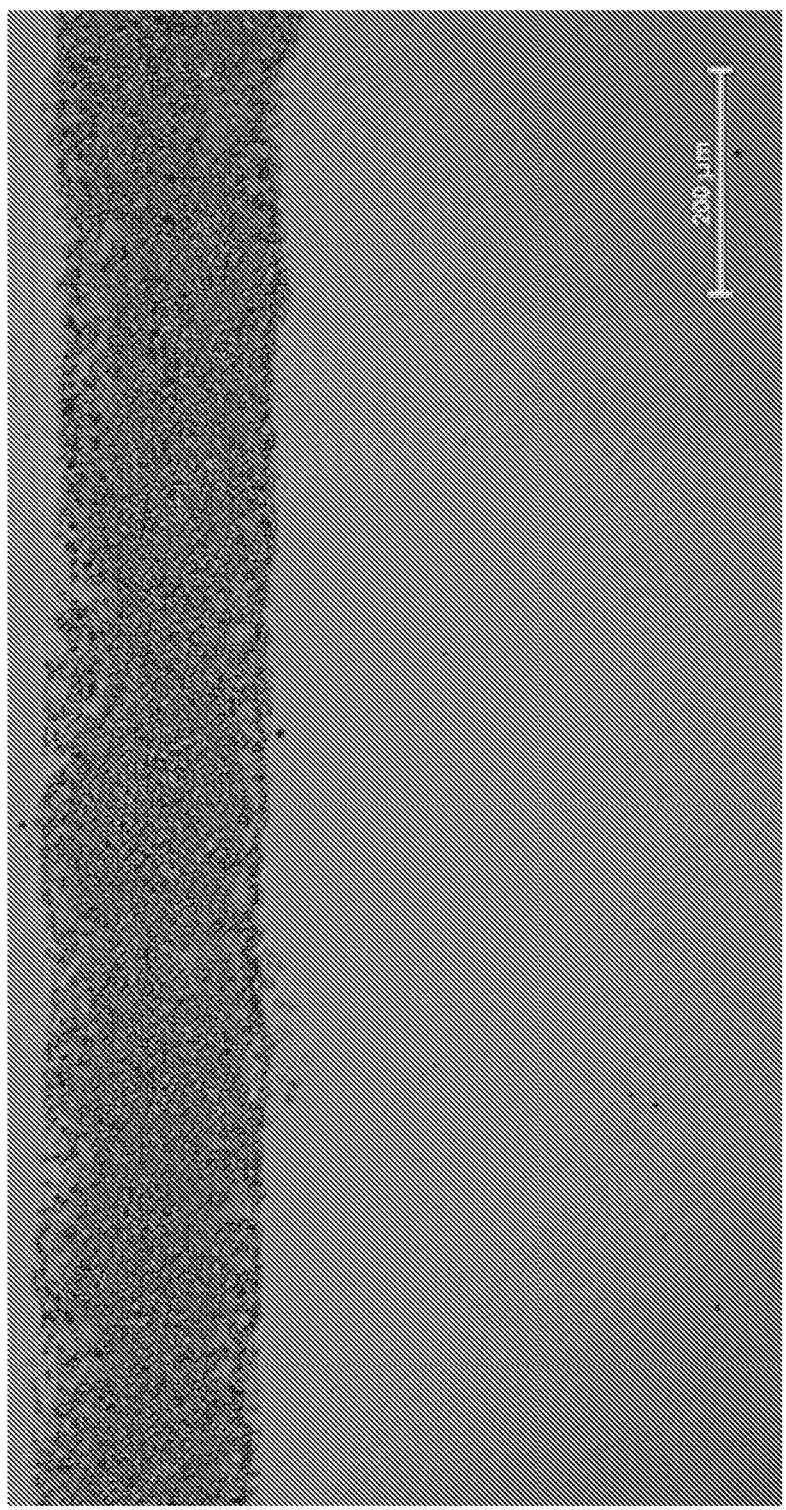
FIG. 10B is an optical image of a print line formed by printing 10 passes of the ink formulation described in Example 4 on $SiO_2$.

Thicknesses increased from ~100 nm for 1 pass to ~900 nm for 60 passes. Profile data for 10 passes and an optical image are shown in FIG. 10A & 10B.

Figure 11:
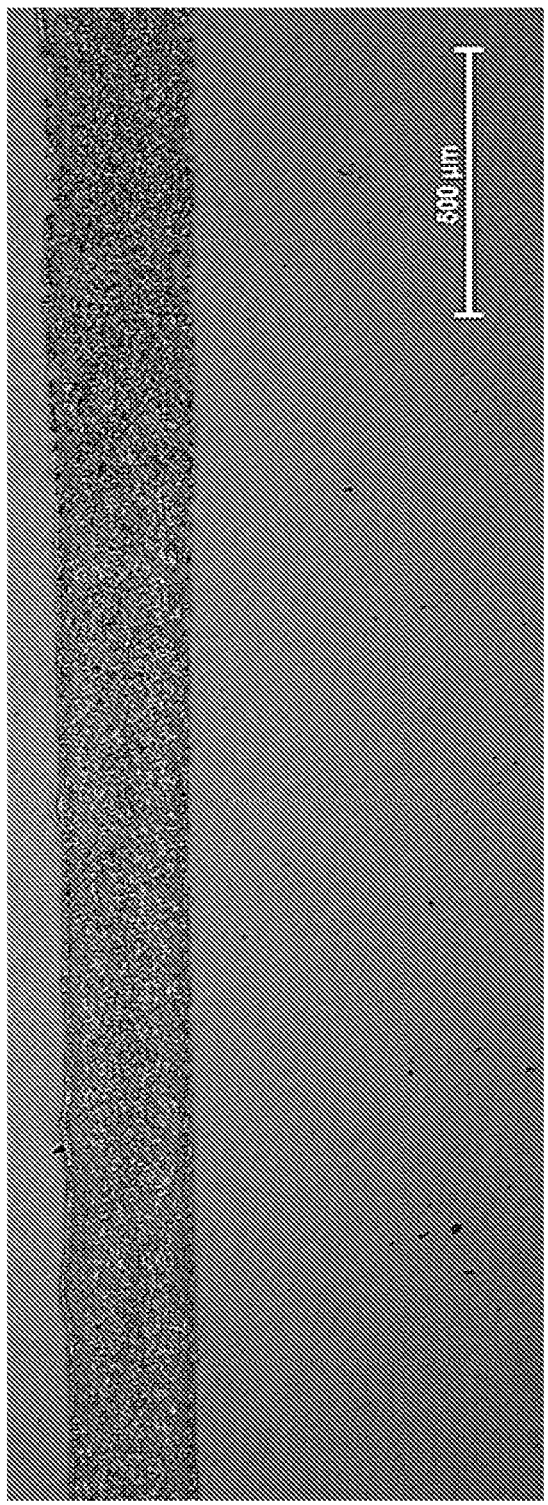
FIG. 11 is an optical image of a print line shown in FIG. 10 B following annealing at 300° C. for 1 hour under argon.

Annealing at 300° C. for 1 hour under Argon was performed causing no change to line structure (FIG. 11).

Any of the above ink formulations (examples 1-4) can be scaled up or down, as long as the ratio of chemicals are kept the same.

The invention claimed is:

1. An ink formulation suitable for inkjet printing, said formulation comprising a plurality of nanosheets dispersed in an aqueous vehicle and having a surface tension within the range of 20 to 50 mN/m when the temperature is 20-25 degrees C.;
  wherein:
  (i) greater than 50% of the nanosheets comprise less than ten layers of an inorganic layered material;
  (ii) the inorganic material is selected from the group consisting of graphene, hexagonal boron nitride, bismuth strontium calcium copper oxide (BSCCO), transition metal dichalocogenides (TMDCs), $Sb_2Te_3$, $Bi_2Te_3$ and $MnO_2$;
  (iii) the concentration of nanosheets of inorganic material in the aqueous vehicle is greater than 0.01 mg/ml; and
  (iv) the ink formulation further comprises:
    (a) 1×10$^{-4}$ mol/L to 200×10$^{-4}$ mol/L of at least one water soluble polycyclic aromatic compound or a salt thereof; wherein the or each polycyclic aromatic compound independently has a ring system which comprises from 2 to 10 fused aromatic benzene rings, the ring system being substituted with from 1 to 6 independently selected hydrophillic groups, each hydrophilic group consisting of less than 20 atoms;
    (b) at least one viscosity modifier, which is a water miscible co-solvent, in an amount of 0.1 to 50 wt. %; and
    (c) at least one surface tension modifier, in the form of a water-soluble surface active material in an amount sufficient to prove a formulation having a surface tension of 20 to 50 mN/m when the temperature is 20-25 degrees C.

2. An ink formulation according to claim 1, wherein the formulation has a viscosity within the range of 2 to 30 cPs when the temperature is 20-25 degrees C.

3. An ink formulation according to claim 1, wherein the formulation has a viscosity within the range of 10 to 12 cPs when the temperature is 20-25 degrees C. and/or a surface tension within the range 28 to 45 mN/m when the temperature is 20-25 degrees C.

4. An ink formulation according to claim 1, wherein greater than 60% of the nanosheets of inorganic material present in the ink formulations of the present invention comprise less than ten layers of the inorganic material.

5. An ink formulation according to claim 1, wherein greater than 80% of the nanosheets of inorganic material present in the ink formulations of the present invention comprises less than 10 layers of the inorganic material.

6. An ink formulation according to claim 1, wherein the length and width dimensions of the nanosheets are within the range of 10 nm to 2 microns.

7. An ink formulation according to claim 1, wherein the length and width dimensions of the nanosheets are within the range of 10 nm to 1 micron.

8. An ink formulation according to claim 1, wherein:
  (i) greater than 75% by weight of the particles have a thickness of from 3 to 8 molecular layers;
  (ii) the concentration of nanosheets in the aqueous vehicle is within the range of 0.01 to 5 mg/ml, and/or (iii) the water content of the formulation is within the range of greater than or equal to 80 wt. % to less than or equal to 99.99 wt. % relative to the total weight of the formulation.

9. An ink formulation according to claim 1, wherein the polycyclic aromatic compound has a ring system which comprises from 2 to 8 or 3 to 6 fused benzene rings, the ring system being substituted with from 1 to 4 independently selected hydrophillic groups, each hydrophilic group consisting of $SO_3H$, $SO_2H$, $B(OH)_2$, $CO_2H$, OH and $PO_3H$.

10. An ink formulation according to claim 1, wherein the polycyclic aromatic compound is selected from one of the following:

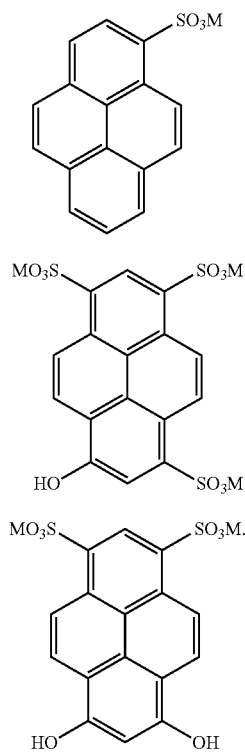

11. An ink formulation according to claim 1, wherein the viscosity modifier is selected from the group consisting of ethylene glycol methyl ether, ethylene glycol, propylene glycol, 1-propanol, ethyl lactate, methyl ethyl ketone (MEK) and sulfolane.

12. An ink formulation according to claim 1, wherein the viscosity modifier is ethylene glycol methyl ether or ethylene glycol.

13. An ink formulation according to claim 1, wherein the surface tension modifier is present in the formulation at an amount of from 0.01 to 2 wt. %.

14. An ink formulation according to claim 1, wherein the inorganic material is graphene.

15. A process for the preparation of an ink formulation according to claim 1, the process comprising:
a) providing multi-layered bulk inorganic material in an aqueous vehicle comprising
$1 \times 10^{-4}$ mol/L to $200 \times 10^{-4}$ mol/L of at least one water soluble polycyclic aromatic compound or a salt thereof; wherein the or each polycyclic aromatic compound independently has a ring system which comprises from 2 to 10 fused aromatic benzene rings, the ring system being substituted with from 1 to 6 independently selected hydrophillic groups, each hydrophilic group consisting of less than 20 atoms;
(ii) at least one viscosity modifier which is a water miscible co-solvent in an amount of from 0.1 to 60 wt. %; and
(iii) at least one surface tension modifier in the form of a water soluble surface active material in an amount sufficient to provide a formulation having a surface tension of 20 to 50 mN/m when the temperature is 20-25 degrees C.;
b) subjecting the multilayered particles of the inorganic material in the aqueous vehicle to energy to obtain an ink formulation comprising an aqueous dispersion of nanosheets in the aqueous vehicle, wherein greater than 50% of the nanosheets comprise less than ten layers of the inorganic layered material; and
c) when the formulation obtained in step b) also comprises multilayered particles of the inorganic layered material, the method optionally further comprises the step of reducing the amount of multilayered particles of the inorganic layered material in the ink formulation.

16. A method of using the ink formulation according to claim 1, comprising using the ink formulation for the inkjet printing of films or tracks on a substrate.

17. A film and/or track prepared by the inkjet printing of an ink formulation according to claim 1 onto a substrate.

18. An electronic device or component comprising a film or track according to claim 17.

* * * * *